US011404846B2

(12) United States Patent
 Murao

(10) Patent No.: US 11,404,846 B2
(45) Date of Patent: Aug. 2, 2022

(54) LASER DEVICE

(71) Applicant: Mitsubishi Electric Corporation, Tokyo (JP)

(72) Inventor: Tadashi Murao, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 403 days.

(21) Appl. No.: 16/636,782

(22) PCT Filed: Sep. 1, 2017

(86) PCT No.: PCT/JP2017/031621
§ 371 (c)(1),
(2) Date: Feb. 5, 2020

(87) PCT Pub. No.: WO2019/043917
PCT Pub. Date: Mar. 7, 2019

(65) Prior Publication Data
US 2020/0381896 A1    Dec. 3, 2020

(51) Int. Cl.
*H01S 5/10* (2021.01)
*H01S 5/50* (2006.01)

(52) U.S. Cl.
CPC ............. *H01S 5/1007* (2013.01); *H01S 5/50* (2013.01)

(58) Field of Classification Search
CPC .............................. H01S 5/1007; H01S 5/1032
USPC ........................................................ 359/344
See application file for complete search history.

(56) References Cited

U.S. PATENT DOCUMENTS 8,467,122 B2 * 6/2013 Zheng ............... H01S 5/142
                                                        359/344
2009/0122817 A1 * 5/2009 Sato ................ G02B 6/12007
                                                         372/20

FOREIGN PATENT DOCUMENTS

JP        2015-154052 A       8/2015

OTHER PUBLICATIONS

Fan, "Laser Beam Combining for High-Power, High-Radiance Sources," IEEE Journal of Selected Topics in Quantum Electronics, vol. 11, No. 3, May / Jun. 2005, pp. 567-577.
Kita et al., "Silicon Photonic Wavelength-Tunable Laser Diode With Asymmetric Mach-Zehnder Interferometer," IEEE Journal of Selected Topics in Quantum Electronics, vol. 20, No. 4, Jul. / Aug. 2014, 6 pages.
Saitoh et al., "Full-Vectorial Finite Element Beam Propagation Method with Perfectly Matched Layers for Anisotropic Optical Waveguides," Journal of Lightwave Technology, vol. 19, No. 3, Mar. 2001, pp. 405-413.

(Continued)

*Primary Examiner* — Tuan N Nguyen
(74) *Attorney, Agent, or Firm* — Birch, Stewart, Kolasch & Birch, LLP

(57) ABSTRACT

A laser device (1) includes: a branch waveguide (23) configured to split light propagating from an optical amplifier (10) into a plurality of light beams and output the plurality of light beams; a multi-core waveguide (27) including a plurality of waveguide cores (24 to 26) configured to carry the plurality of light beams input from the branch waveguide (23); and a light reflector (31) optically coupled to a light input/output end of the multi-core waveguide (27). The waveguide cores (24 to 26) are configured to extend along the same direction, and placed in proximity to one another to enable optical coupling between adjacent waveguide cores of the waveguide cores (24 to 26).

19 Claims, 24 Drawing Sheets

(56) References Cited

OTHER PUBLICATIONS

Saitoh et al., "Full-Vectorial Imaginary-Distance Beam Propagation Method Based on a Finite Element Scheme: Application to Photonic Crystal Fibers," IEEE Journal of Quantum Electronics, vol. 38, No. 7, Jul. 2002, pp. 927-933.

* cited by examiner

FIG. 4
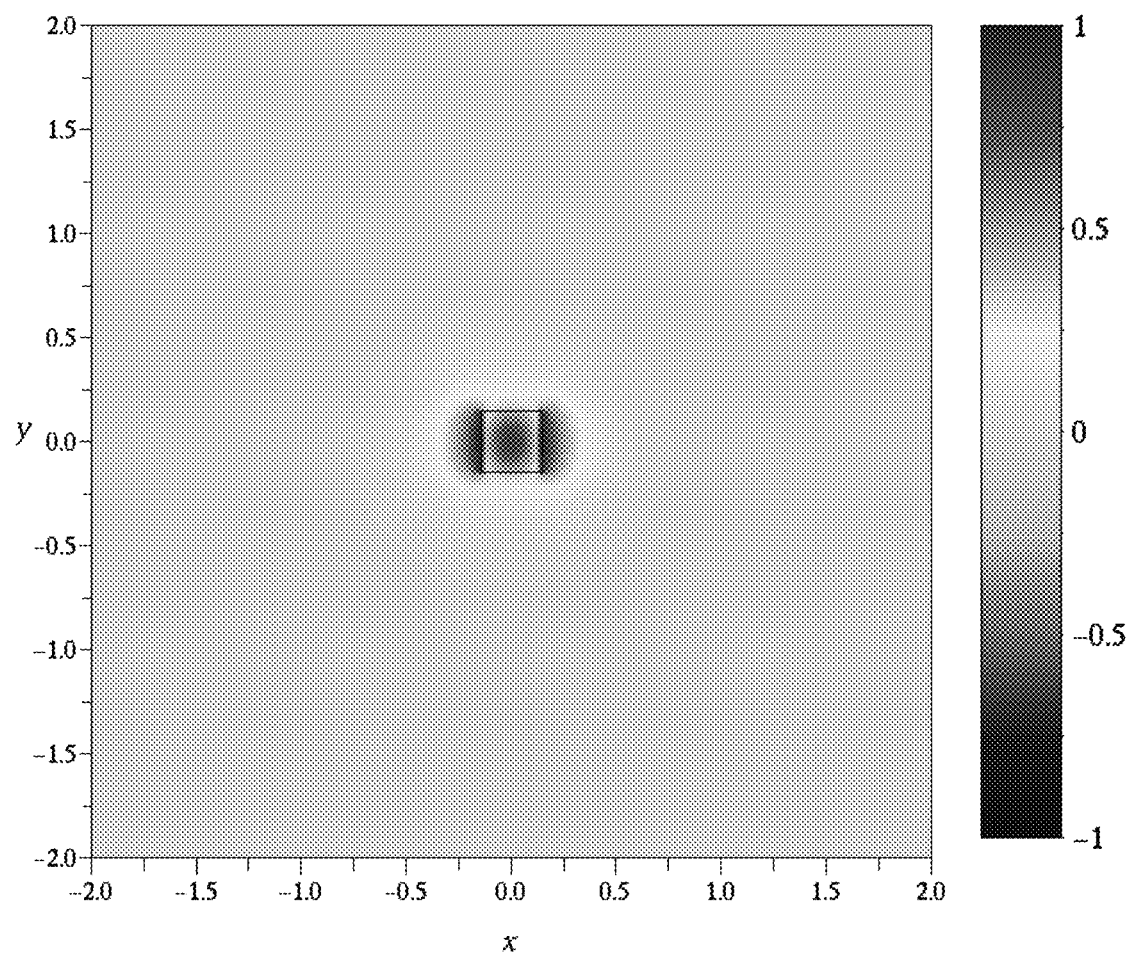
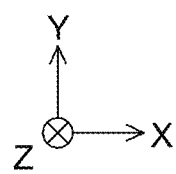

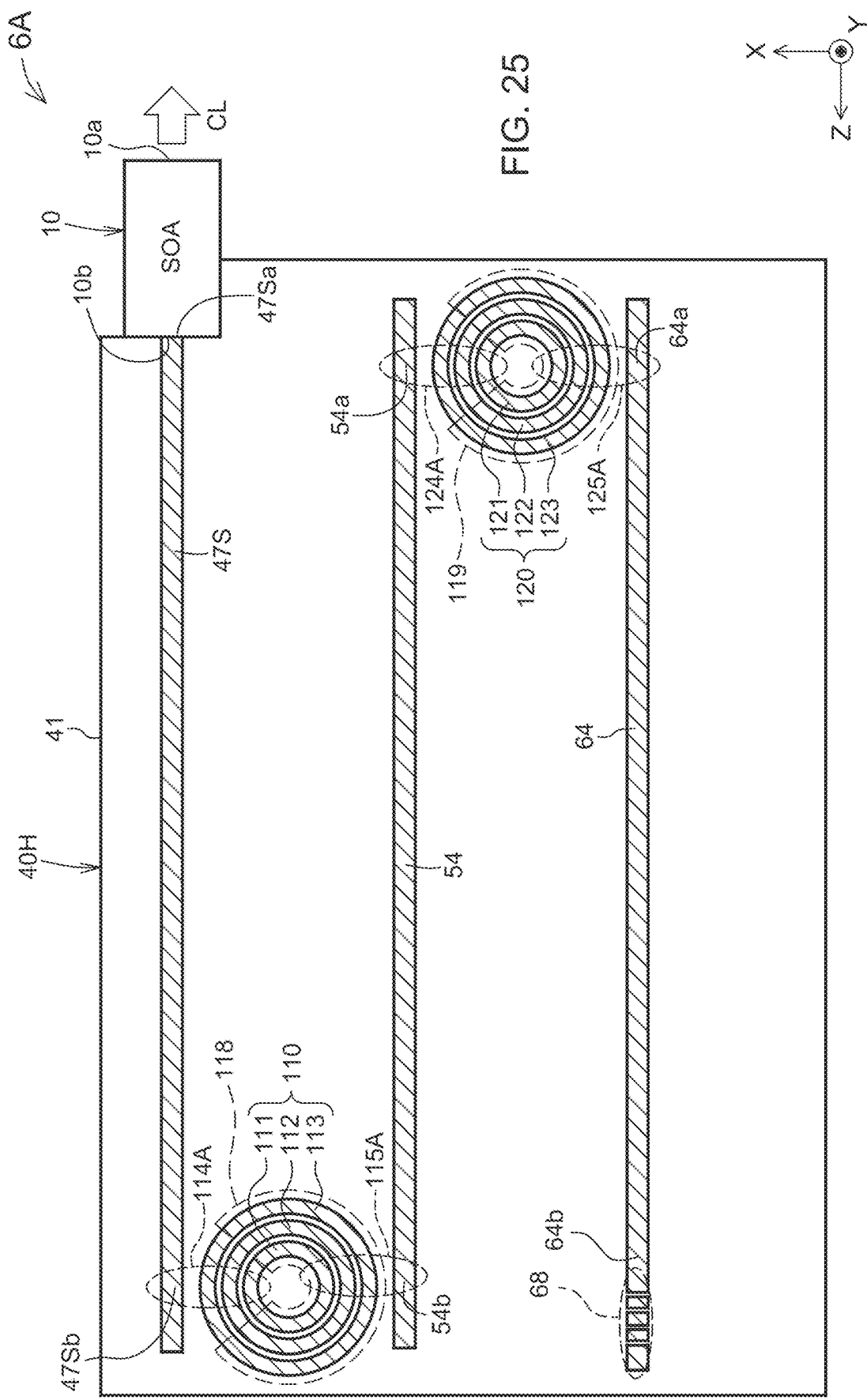

LASER DEVICE

TECHNICAL FIELD

The present invention relates to a laser device, and more particularly, to a laser device including an optical amplifier and an optical waveguide structure to be coupled to the optical amplifier.

BACKGROUND ART

In recent years, laser light sources compatible with digital coherent systems have been required in optical communication technology for use in communication networks such as a middle-distance metro network and a data center network comprised of a network connecting between a large number of servers. The digital coherent system refers to an optical communication system produced by an amalgam of coherent optical communication technology and digital signal processing. For the laser light sources compatible with the digital coherent system, it is required to have as narrow a wavelength bandwidth of output light as possible (in other words, as narrow a spectral line-width of the output light as possible) and to have high output optical power.

As a laser light source for use in the optical communication technology, a laser light source has been known which is comprised of an optical waveguide structure and a semiconductor optical amplifier (SOA) serving as a gain medium that produces stimulated emission. Non-Patent Literature 1 as listed below discloses, as such a laser light source a wavelength-tunable laser diode using silicon photonics. The wavelength-tunable laser diode includes an SOA and a silicon waveguide section with a resonator structure coupled to the SOA. In the wavelength-tunable laser diode, a narrow spectral line-width of output light becomes feasible by providing the resonator structure outside the SOA. Further, the resonator structure includes two ring resonators and a heater for individually controlling temperatures of the ring resonators. By changing the temperatures of the ring resonators using the heater, the optical path length of the entire resonator structure can be changed to adjust its resonance wavelength condition, thereby enabling tunable wavelength control.

CITATION LIST

Non-Patent Literature

Non-Patent Literature 1: T. Kita et al., "*Silicon photonic wavelength-tunable laser diode with asymmetric Mach-Zehnder interferometer*," IEEE J. Select. Top. Quant. Electron. 20, 8201806 (2014).

SUMMARY OF INVENTION

Technical Problem

With the conventional wavelength-tunable laser diode as described above, there is the problem that destabilization of the output wavelength arises from a non-linear optical effect in the silicon waveguide of the resonator structure. Since there is a large difference in refractive index between a core and a cladding in the silicon waveguide, while the strong light confinement effect in the core can be achieved, two-photon absorption (TPA), which is one type of the non-linear optical effect, is likely to occur for high output optical power. Furthermore, a phenomenon called free carrier absorption (FCA) occurs where free carriers generated from the TPA absorb light. Since the FCA changes the refractive index of the silicon waveguide, destabilization of the output wavelength arises. Therefore, a trade-off exists between the narrowing of the spectral line-width of the output light and the increasing of the output power.

In view of the foregoing, it is an object of the present invention to provide a laser device capable of suppressing occurrence of a non-linear optical effect to achieve stabilization of an output wavelength.

Solution to Problem

In accordance with an aspect of the present invention, a laser device is provided which includes: an optical amplifier; a branch waveguide having N branch ends and a light input/output end that is optically coupled to the optical amplifier where N is an integer equal to or larger than two, the branch waveguide being configured to split light propagating from the optical amplifier into N light beams and output the N light beams from the N branch ends, respectively; a multi-core waveguide having a first light input/output end that is optically coupled to the N branch ends of the branch waveguide, and having N waveguide cores configured to carry the N light beams input from the branch waveguide, respectively; and a light reflector optically coupled to a second light input/output end of the multi-core waveguide, wherein the N waveguide cores are placed in proximity to one another to enable optical coupling between adjacent waveguide cores of the N waveguide cores.

Advantageous Effects of Invention

In accordance with the present invention, generation of a non-linear optical effect is suppressed by a super mode. Therefore, stabilization of the output wavelength can be implemented.

BRIEF DESCRIPTION OF DRAWINGS

FIG. 4 is a diagram with gray-tone values (grayscale values) illustrating a distribution of x-direction components of an electric field in a cross section taken along line II-II.

FIG. 25 is a plan view illustrating a schematic configuration of a laser device that is a variation example of the sixth embodiment.

DESCRIPTION OF EMBODIMENTS

Hereinafter, various embodiments in accordance with the present invention will be described in detail with reference to the accompanying drawings. Note that components denoted by the same reference sign throughout the drawings have the same configuration and the same function.

First Embodiment

Figure 1:
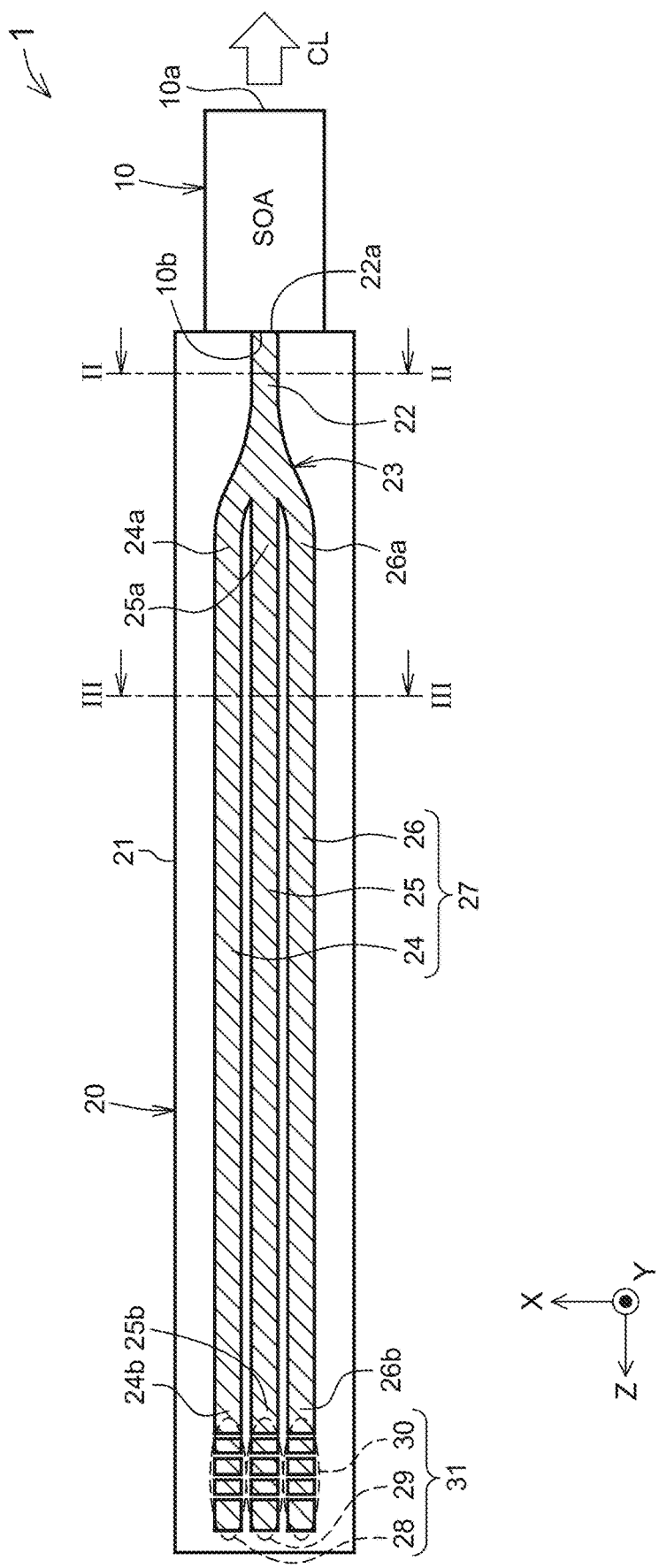
FIG. 1 is a plan view illustrating a schematic configuration of a laser device of a first embodiment in accordance with the present invention.
Figure 2:
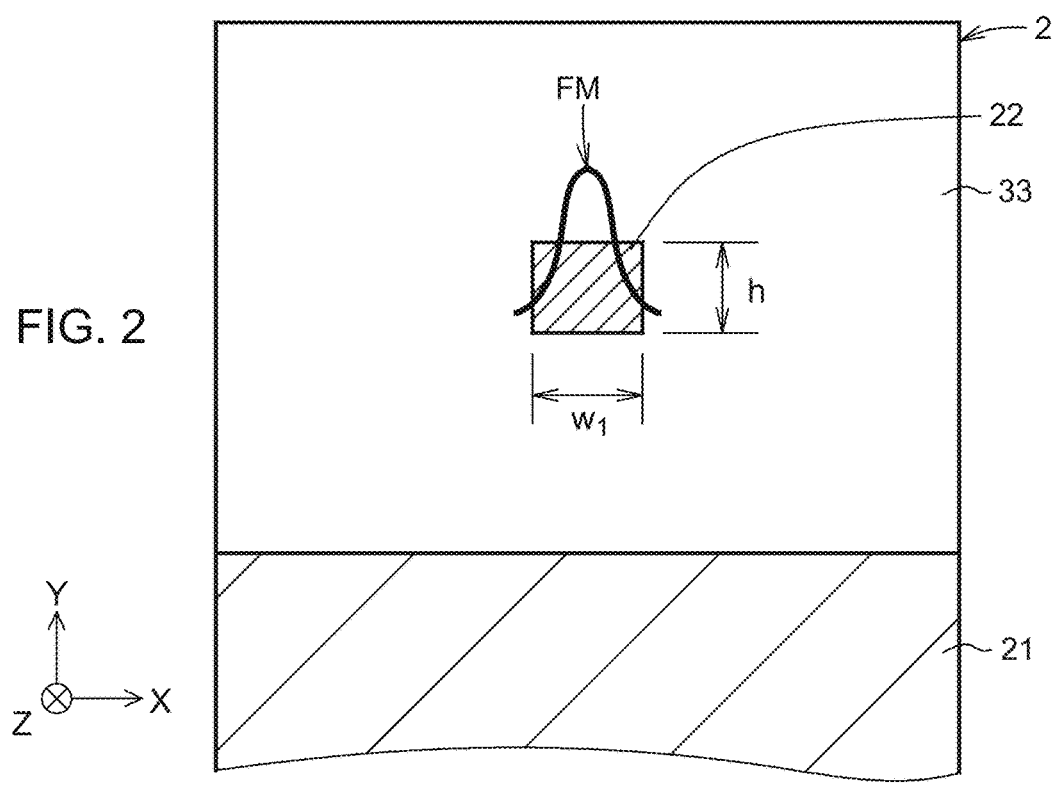
FIG. 2 is a diagram illustrating a schematic cross section taken along line II-II of an input/output waveguide illustrated in FIG. 1.
Figure 3:
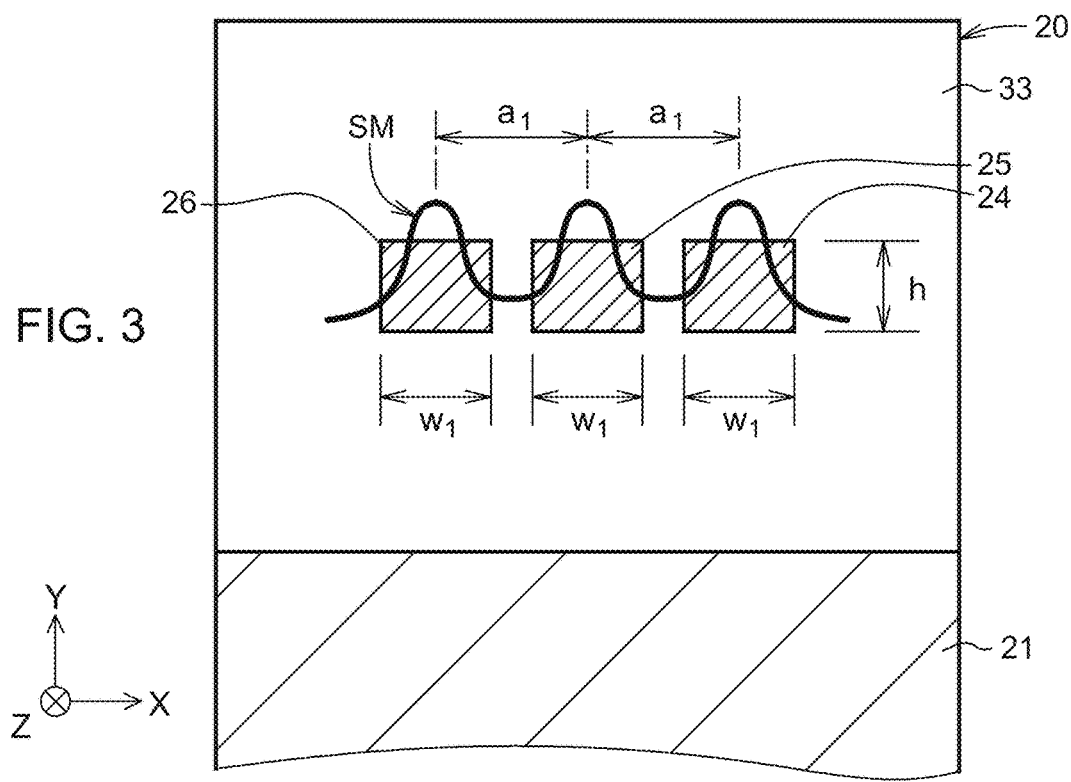
FIG. 3 is a diagram illustrating a schematic cross section taken along line III-III of a multi-core waveguide illustrated in FIG. 1.

FIG. 1 is a plan view illustrating a schematic configuration of a laser device 1 of a first embodiment in accordance with the present invention. FIG. 2 is a diagram illustrating a schematic cross section taken along line II-II of an input/output waveguide 22 illustrated in FIG. 1, and FIG. 3 is a diagram illustrating a schematic cross section taken along line III-III of a multi-core waveguide 27 illustrated in FIG. 1.

As illustrated in FIG. 1, the laser device 1 includes a semiconductor optical amplifier (SOA) 10, and an optical waveguide structure 20 optically coupled to the SOA 10. In FIG. 1, illustration of a cladding layer covering a waveguide pattern is omitted for convenience of explanation.

As illustrated in FIG. 1, the optical waveguide structure 20 includes a semiconductor substrate layer 21, and further includes, on the semiconductor substrate layer 21, an input/output waveguide 22, a branch waveguide 23, a multi-core waveguide 27 including three waveguide cores 24 to 26, and a light reflector 31 including three mirrors (reflectors) 28 to 30. Further, as illustrated in cross-sectional views of FIGS. 2 and 3, the optical waveguide structure 20 includes the semiconductor substrate layer 21 and a cladding layer 33 deposited on the semiconductor substrate layer 21, and the cladding layer 33 covers the input/output waveguide 22, the branch waveguide 23, the multi-core waveguide 27, and the light reflector 31. Note that, although the input/output waveguide 22, the branch waveguide 23, the multi-core waveguide 27, and the light reflector 31 are completely covered by the cladding layer 33 in the present embodiment, no limitation thereto is intended.

A method for manufacturing such an optical waveguide structure 20 is, for example, as follows. First, a silicon on insulator (SOI) substrate is prepared. The SOI substrate is a substrate layer in which a supporting substrate layer, buried silicon oxide layer, and silicon layer are laminated in this order. By patterning of a silicon layer using a selective etching technique, a pattern of the silicon layer constituting the input/output waveguide 22, branch waveguide 23, multi-core waveguide 27, and light reflector 31 can be formed. Next, a silicon oxide layer is deposited on the pattern of the silicon layer by chemical vapor deposition (CVD). As a result, the optical waveguide structure 20 is fabricated which includes the deposited silicon oxide layer and buried silicon oxide layer as a cladding layer and includes the silicon layer pattern as a core layer. In this manufacturing method, the semiconductor substrate layer 21 is constituted by a supporting substrate layer. Note that, instead of this manufacturing method, the cladding layer may be formed by selectively oxidizing the silicon layer of the SOI substrate other than the portion to be the core layer.

The input/output waveguide 22 includes a single waveguide core as illustrated in FIG. 1, and includes a light input/output end 22a optically coupled to a light input/output end face 10b of the SOA 10. The SOA 10 can input light to the optical waveguide structure 20 through the light input/output end face (back-end face) 10b.

The multi-core waveguide 27 includes the three waveguide cores 24, 25, and 26, which extend along the same direction (Z-axis direction) and are disposed to be spaced apart at equal intervals in the X-axis direction. As will be described later, in order to excite a super mode, the waveguide cores 24, 25, 26 are placed in proximity to one another to enable optical coupling between the adjacent waveguide cores of the waveguide cores 24, 25, and 26.

The branch waveguide 23 includes a single light input/output end optically coupled to the input/output waveguide 22, and three branch ends optically coupled to light input/output ends of end portions 24a, 25a, and 26a of the waveguide cores 24, 25, and 26. The branch waveguide 23 can split light propagating from the input/output waveguide 22 into three light beams, and can feed the three light beams into the waveguide cores 24, 25, and 26, respectively.

The light reflector 31 includes the three mirrors 28, 29, and 30 optically coupled to the light input/output ends of the other end portions 24b, 25b, and 26b of the waveguide cores 24, 25, and 26. Those mirrors 28, 29, and 30 have a function of reflecting the light propagating through the respective waveguide cores 24, 25, and 26 in the direction of the SOA 10. Accordingly, the SOA 10 and the optical waveguide structure 20 have a resonator structure as a whole. The mirrors 28 to 30 may be implemented by, for example, Bragg gratings, or may be implemented by cleavage facets of a crystal.

Note that, although the core number of the waveguide cores 24 to 26 is three and the number of branch ends of the branch waveguide 23 is three in the present embodiment, each of the core number and the number of branch ends is not limited to three. The configurations of the branch waveguide 23 and the multi-core waveguide 27 can be changed appropriately to set each of the core number and the number of branch ends to N where N is an integer equal to or larger than two.

The SOA 10 is a gain medium that causes stimulated emission. Oscillation occurs when the light amplification in the SOA 10 exceeds the light loss in the optical waveguide structure 20, and laser light CL is obtained. The SOA 10 outputs the laser light CL from a light output end face (front-end face) 10a on the side opposite to the optical waveguide structure 20. One way to obtain a narrower spectral line-width is known to increase the length of the resonator. Further, the wavelength of the laser light CL is determined from the relationship between the length of the resonator and the wavelength, and in a case where the length of the resonator satisfies a resonance condition with respect to the wavelength, the laser light CL with the wavelength is output.

As illustrated in FIG. 2, a fundamental mode FM is excited by light input from the SOA 10 to the optical waveguide structure 20. In the multi-core waveguide 27, the waveguide cores 24 to 26 are placed in proximity to one another to enable propagation of evanescent light between adjacent waveguide cores. Therefore, the waveguide cores 24 and 25, and waveguide cores 25 and 26 are optically coupled, thereby exciting a propagation mode called a super mode SM as illustrated in FIG. 3. The super mode is excited using the branch waveguide 23 so that excitation of the higher-order super mode is suppressed, and thus, only the 0-th-order super mode can be selectively excited.

FIG. 4 is a diagram illustrating, using concentration values (grayscale values), distribution of x-direction components of an electric field in a cross section taken along line II-II in a case where the propagation mode (core mode) of the input/output waveguide 22 is the fundamental mode. In FIG. 4, the x axis represents positions corresponding to the X-axis direction, and the y axis represents positions corresponding to the Y-axis direction. The input/output waveguide 22 disposed at the position (x, y)=(0, 0) is illustrated by a solid line. In the distribution of the x-direction components in FIG. 4, a value of a positive x component is larger as a concentration value is higher. This fundamental mode was achieved under the conditions that the input/output waveguide 22 includes silicon, the cladding layer 33 includes silica glass, a core width $w_1$ of the input/output waveguide 22 is 290 nm, its height h is 290 nm, a refractive index $n_{si}$ of the input/output waveguide 22 is 3.5, a refractive index $n_{sio2}$ of the cladding layer 33 is 1.45, and a wavelength λ is 1.55 μm. The calculation of the distribution of the x-direction components was carried out using a vector finite element scheme disclosed in Non-Patent Literature 2 as listed below.

Non-Patent Literature 2: K. Saitoh and M. Koshiba, "*Full-vectorial imaginary-distance beam propagation method based on a finite element scheme: Application to photonic crystal fibers,*" IEEE J. Quantum Electron. 38, 927 (2002).

Figure 5:
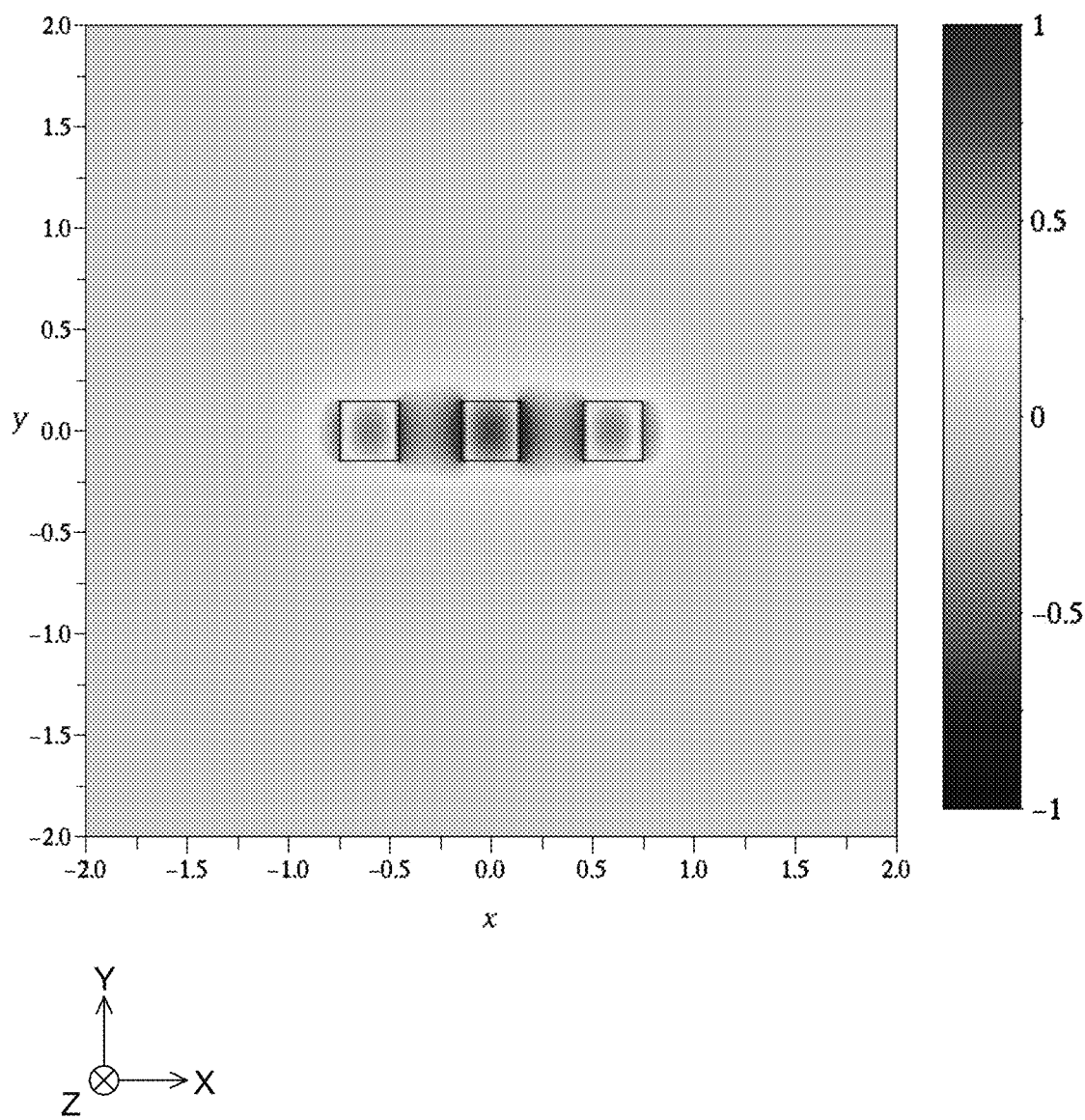
FIG. 5 is a diagram with gray-tone values (grayscale values) illustrating a distribution of the x-direction components of an electric field in a cross section taken along line III-III.

FIG. 5 is a diagram with gray-tone values (grayscale values) illustrating a distribution of the x-direction components of the electric field in a cross section taken along line III-III in a case where a super mode is excited in the multi-core waveguide 27 relative to the fundamental mode illustrated in FIG. 4. In FIG. 5, the waveguide cores 24, 25, and 26, which are arranged along the X axis direction, are illustrated by rectangular solid lines. This super mode was calculated under the conditions that the core widths $w_1$ and heights h of the waveguide cores 24, 25, and 26 are all the same, and a core interval $a_1$ is 600 nm.

Since the core interval $a_1$ of the waveguide cores 24, 25, and 26 is small enough to the extent that evanescent light can propagate between the waveguide cores 24 and 25 and between the waveguide cores 25 and 26, it can be understood from FIG. 5 that the waveguide cores 24 and 25, and waveguide cores 25 and 26 are in close proximity to one another enough to excite the 0-th-order super mode. The super mode that propagates through a coupling waveguide including the three waveguide cores 24, 25, and 26 is reflected by the light reflector 31 on the back-end face, and then converted into the fundamental mode by the branch waveguide 23 to be made incident on the SOA 10. At this time, a wavelength satisfying the resonance condition between the light reflector 31 and a mirror on the side of the front-end face 10a of the SOA 10 is a wavelength of the output laser light CL.

As illustrated in FIG. 5, the waveguide cores 24 to 26 are in close proximity to one another enough to excite the super mode, it can be said that the waveguide cores 24 to 26 are optically coupled to one another. With the super mode being excited in the multi-core waveguide 27, the effective core cross-sectional area of the cross section taken along line III-III can be enlarged. Therefore, even in the case of high optical output power or in the case of adopting a long resonator length, a non-linear optical effect can be suppressed. Furthermore, it becomes possible to achieve both higher optical output and a narrower spectral line-width. Therefore, there is an advantage that phase adjustment of each core element is not required as in a coherent beam combining (CBC) method known as a method for increasing output of a conventional laser light source.

Here, the CBC is a method for coherently coupling arrayed fiber lasers. According to the CBC, an output limit value can be increased by the number of arrays being increased. Furthermore, it is also possible to change a laser emitting direction by controlling the phase state of each laser. The CBC is disclosed in, for example, Non-Patent Literature 3 as listed below.

Non-patent Literature 3: T. Y. Fan, "*Laser Beam Combining for High-Power, High-Radiance Sources,*" IEEE J. Select. Top. Quant. Electron. 11, 567 (2005).

As described above, in the first embodiment, the waveguide cores 24 to 26 are placed in proximity to one another to enable optical coupling between the adjacent waveguide cores of the waveguide cores 24 to 26, and thus, the super mode can be excited in the multi-core waveguide 27. This super mode increases the effective core cross-sectional area of the multi-core waveguide 27, and thus, occurrence of the non-linear optical effect can be suppressed and the output wavelength can be stabilized.

Furthermore, in the present embodiment, excitation of the higher-order super mode is suppressed by using the branch waveguide 23, and thus, multimode oscillation can be suppressed even in the case of using a coupling waveguide including the waveguide cores 24 to 26.

Figure 6:
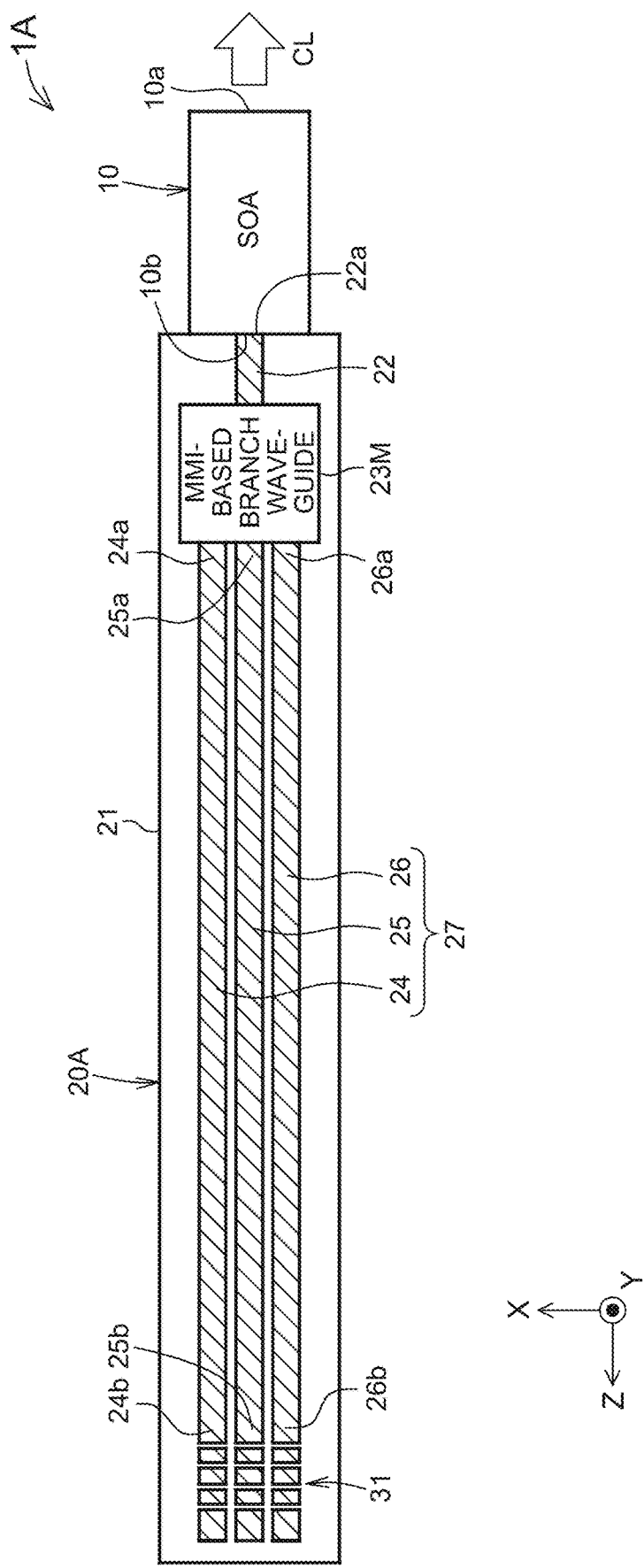
FIG. 6 is a plan view illustrating a schematic configuration of a laser device that is a variation example of the first embodiment.

FIG. 6 is a plan view illustrating a schematic configuration of a laser device 1A that is a variation example of the first embodiment. The laser device 1A of the variation example includes the SOA 10, and an optical waveguide structure 20A. A configuration of the optical waveguide structure 20A of the variation example is the same as the configuration of the optical waveguide structure 20 of the first embodiment described above except that a multimode interference (MMI)-based branch waveguide 23M in FIG. 6 is included instead of the branch waveguide 23 described above. Even in the case of the present embodiment, an effect similar to that of the first embodiment described above can be exerted.

Second Embodiment

Figure 7:
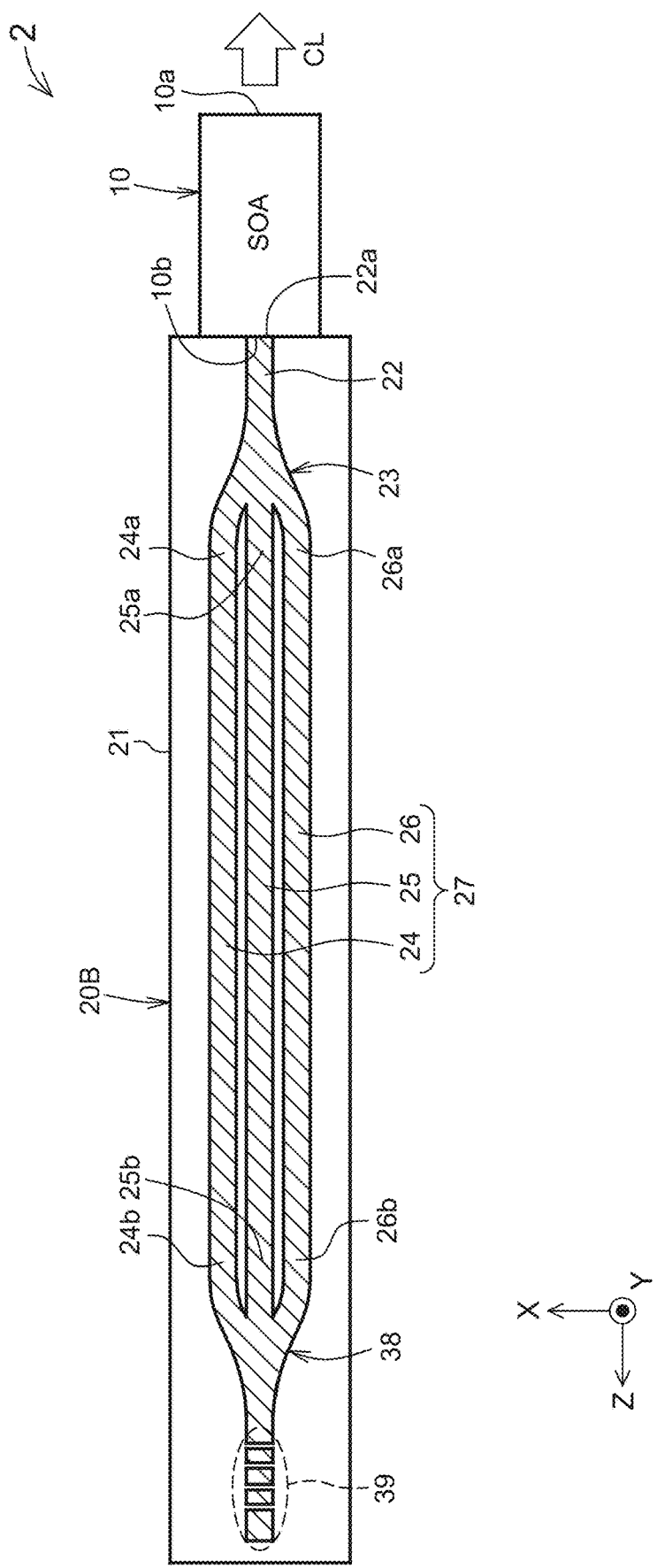
FIG. 7 is a plan view illustrating a schematic configuration of a laser device of a second embodiment in accordance with the present invention.

FIG. 7 is a plan view illustrating a schematic configuration of a laser device 2 of a second embodiment in accordance with the present invention. As illustrated in FIG. 7, the laser device 2 of the present embodiment includes an SOA 10, and an optical waveguide structure 20B. A configuration of the optical waveguide structure 20B is the same as the configuration of the optical waveguide structure 20 of the first embodiment except that a branch waveguide (back-end branch waveguide) 38 and a light reflector 39 in FIG. 7 are included instead of the light reflector 31 of the first embodiment.

A method for manufacturing the optical waveguide structure 20B is similar to the method for manufacturing the optical waveguide structure 20 of the first embodiment. The light reflector 39 may be implemented by, for example, Bragg gratings, or may be implemented by cleavage facets of a crystal.

The branch waveguide 38 of the present embodiment is interposed between a multi-core waveguide 27 and the light reflector 39, and includes a single light input/output end optically coupled to the light reflector 39, and three branch ends optically coupled to the light input/output ends of end portions 24b, 25b, and 26b of waveguide cores 24, 25, and 26. The branch waveguide 38 can combine three light beams propagating from the respective waveguide cores 24, 25, and 26 to generate composite light, and can output the composite light to the light reflector 39. Furthermore, the branch waveguide 38 can split light reflected by the light reflector 39 into three light beams, and can feed the three light beams into the waveguide cores 24, 25, and 26.

A 0-th-order super mode that propagates through the waveguide cores 24 to 26 is converted into a fundamental mode that propagates through one waveguide core using the branch waveguide 38 disposed on the back-end side, and is further reflected by the light reflector 39. Therefore, the SOA 10 and the optical waveguide structure 20B constitute a resonator structure.

According to the present embodiment, an effect of suppressing light loss that occurs due to a phase deviation between waveguide cores caused by mirror reflection. Specifically, in the first embodiment, the three mirrors 28 to 30 are provided for the waveguide cores 24 to 26, respectively, possibly causing a phase deviation between the waveguide cores due to production errors of the mirrors 28 to 30, when propagating light is reflected. This leads to light loss with respect to the propagating super mode. In contrast, in the present embodiment, the branch waveguide 38 is disposed between the light reflector 39 and the multi-core waveguide 27, and thus, the super mode is converted into the fundamental mode in the branch waveguide 38. This allows for suppression of light loss due to a phase deviation between waveguide cores.

Note that, although the core number of waveguide cores 24 to 26 is three, the number of branch ends of the branch waveguide 23 provided on the front-end side is three, and the number of branch ends of the branch waveguide 38 provided on the back end side is three in the present embodiment, each of the number of cores and the number of branch ends is not limited to three. The configurations of the branch waveguides 23 and 38 and the multi-core waveguide 27 can be appropriately changed so that each of the number of cores and the number of branch ends becomes N where N is an integer equal to or larger than two.

Figure 8:
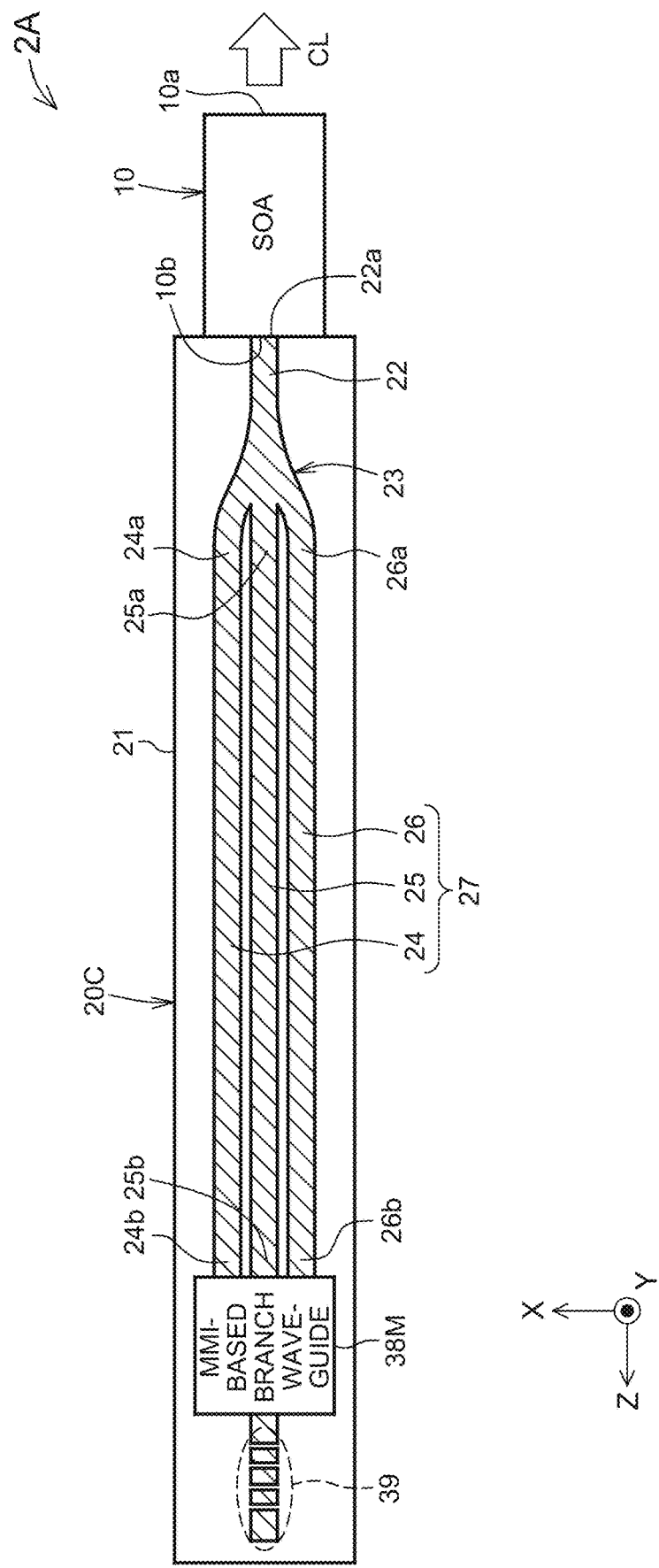
FIG. 8 is a plan view illustrating a schematic configuration of a laser device that is a variation example of the second embodiment.

FIG. 8 is a plan view illustrating a schematic configuration of a laser device 2A that is a variation example of the second embodiment. The laser device 2A of the variation example includes the SOA 10, and an optical waveguide structure 20C. A configuration of the optical waveguide structure 20C of the variation example is the same as the configuration of the optical waveguide structure 20B of the second embodiment described above except that a multimode interference-based branch waveguide 38M in FIG. 8 is included instead of the branch waveguide (back-end branch waveguide) 38 described above. Even in the case of the present variation example, an effect similar to that of the second embodiment described above can be exerted. In the configuration of FIG. 8, the multimode interference-based branch waveguide 23M (FIG. 6) may be adopted instead of the branch waveguide 23.

Third Embodiment

Figure 9:
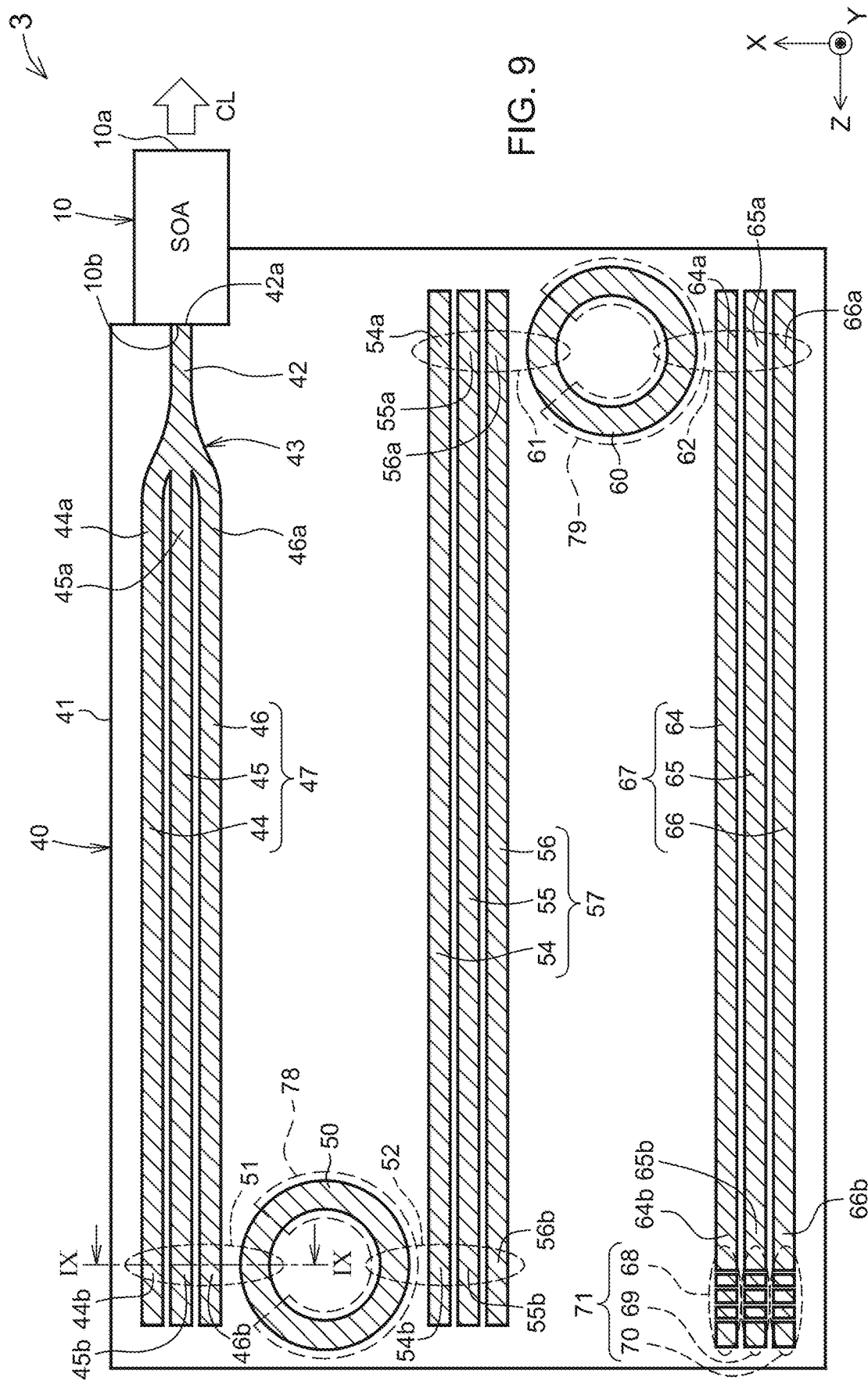
FIG. 9 is a plan view illustrating a schematic configuration of a laser device of a third embodiment of the present invention.
Figure 10:
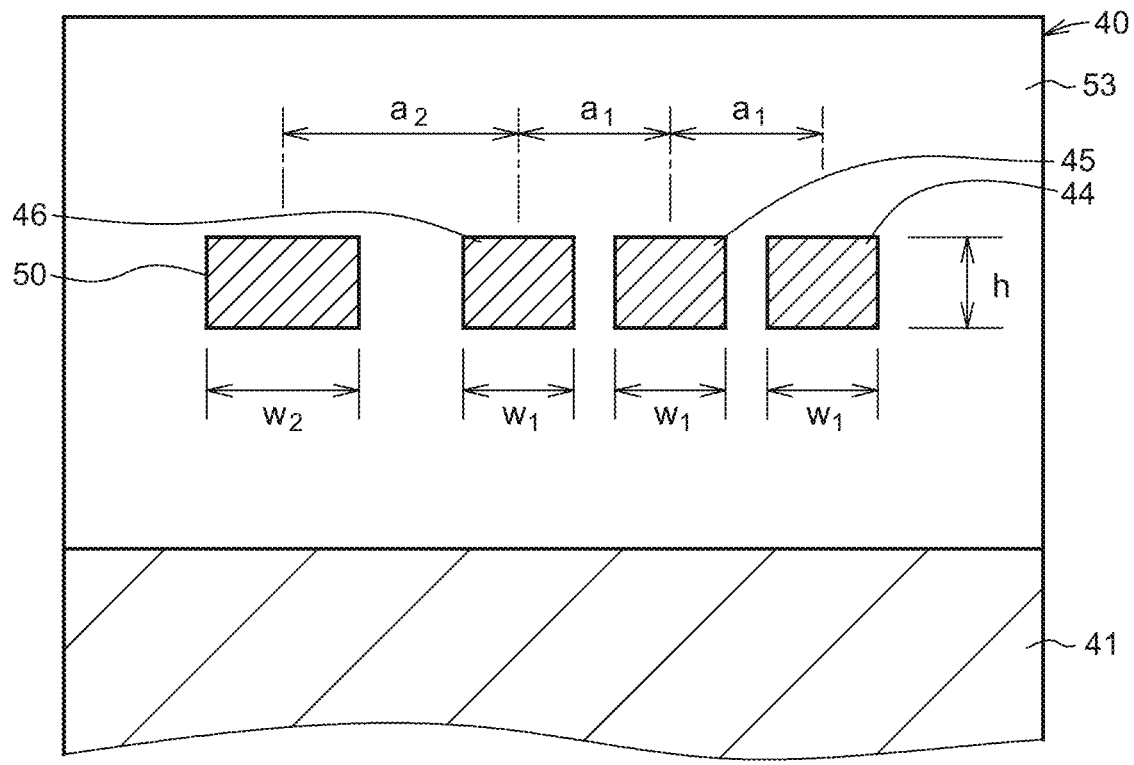
FIG. 10 is a diagram illustrating a schematic cross section taken along line IX-IX of a multi-core waveguide illustrated in FIG. 9.

FIG. 9 is a plan view illustrating a schematic configuration of a laser device 3 of a third embodiment in accordance with the present invention. FIG. 10 is a diagram illustrating a schematic cross section taken along line IX-IX of a multi-core waveguide 47 illustrated in FIG. 9. As illustrated in FIG. 9, the laser device 3 includes an SOA 10, and an optical waveguide structure 40 optically coupled to the SOA 10. In FIG. 9, illustration of a cladding layer covering a waveguide pattern is omitted for convenience of explanation.

As illustrated in FIG. 9, the optical waveguide structure 40 is a ring resonator structure including, on a semiconductor substrate layer 41, an input/output waveguide 42, a branch waveguide 43, a multi-core waveguide 47 including three waveguide cores 44 to 46, a bus waveguide (first bus waveguide) 57 including three waveguide cores 54 to 56, a bus waveguide (second bus waveguide) 67 including three waveguide cores 64 to 66, a light reflector 71 including three mirrors (reflectors) 68 to 70, ring resonators (first and second ring resonators) 50 and 60, and heaters (electrodes) 78 and 79 that function as temperature adjusting elements for adjusting temperatures of those ring resonators 50 and 60.

Further, as illustrated in a cross-sectional view of FIG. 10, the optical waveguide structure 40 includes the semiconductor substrate layer 41, and a cladding layer 53 deposited on the semiconductor substrate layer 21, and the cladding layer 53 covers the input/output waveguide 42, the branch waveguide 43, the multi-core waveguide 47, the bus waveguides 57 and 67, the light reflector 71, and the ring resonators 50 and 60. Note that, although the input/output waveguide 42, the branch waveguide 43, the multi-core waveguide 47, the bus waveguides 57 and 67, the light reflector 71, and the ring resonators 50 and 60 are completely covered by the cladding layer 53 in the present embodiment, no limitation thereto is intended. A method for manufacturing such an optical waveguide structure 40 is similar to the method for manufacturing the optical waveguide structure 20 of the first embodiment described above.

The input/output waveguide 42 includes a single waveguide core as illustrated in FIG. 9, and includes a light input/output end 42a optically coupled to a light input/output end face 10b of the SOA 10. The SOA 10 can input light to the optical waveguide structure 40 through the light input/output end face (back-end face) 10b.

The branch waveguide 43 includes a single light input/output end optically coupled to the input/output waveguide 42, and three branch ends optically coupled to light input/output ends of end portions 44a, 45a, and 46a of the waveguide cores 44, 45, and 46. The branch waveguide 43 can split light propagating from the input/output waveguide 42 into three light beams, and can feed the three light beams into the waveguide cores 44, 45, and 46.

The multi-core waveguide 47 includes the three waveguide cores 44, 45, and 46, which extend along the same direction (Z-axis direction) and are disposed to be spaced apart at equal intervals in the X-axis direction. In a similar manner to the first embodiment, in order to excite a super mode, those waveguide cores 44, 45, and 46 are placed in proximity to one another to enable optical coupling between the adjacent waveguide cores of the waveguide cores 44, 45, and 46. Accordingly, evanescent light can propagate between the adjacent waveguide cores.

Note that, although the core number of the waveguide cores 44 to 46 is three and the number of branch ends of the branch waveguide 43 is three in the present embodiment, each of the core number and the number of branch ends is not limited to three. The configurations of the branch waveguide 43 and the multi-core waveguide 47 can be changed appropriately to set each of the core number and the number of branch ends to N where N is an integer equal to or larger than two.

The ring resonator (first ring resonator) 50 includes an annular waveguide core (single core). One end of the ring resonator 50 is disposed to be optically coupled to end portions 44b, 45b, and 46b of the waveguide cores 44, 45, and 46. With this arrangement, a directional coupler 51 is formed by the one end of the ring resonator 50 and the end portions 44b, 45b, and 46b of the waveguide cores 44, 45, and 46.

The bus waveguide (first bus waveguide) 57 includes the three waveguide cores 54, 55, and 56, which extend along the same direction (Z-axis direction) and are disposed to be spaced apart at equal intervals in the X-axis direction. In a similar manner to the first embodiment, in order to excite the super mode, those waveguide cores 54, 55, and 56 are placed in proximity to one another to enable optical coupling between the adjacent waveguide cores of the waveguide cores 54, 55, and 56. Accordingly, evanescent light can propagate between the adjacent waveguide cores. One end portions 54b, 55b, and 56b of the waveguide cores 54, 55, and 56 are disposed to be optically coupled to the other end of the ring resonator 50. With this arrangement, a directional coupler 52 is formed by the other end of the ring resonator 50 and the end portions 54b, 55b, and 56b of the waveguide cores 54, 55, and 56.

Note that, although the core number of the waveguide cores 54 to 56 in the bus waveguide 57 is three in the present embodiment, no limitation thereto is intended. The configuration of the bus waveguide 57 can be changed appropriately to set the core number to M where M is an integer equal to or larger than two.

The other end portions 54a, 55a, 56a of the waveguide cores 54, 55, and 56 in the bus waveguide 57 are optically coupled to one end of another ring resonator (second ring resonator) 60. As illustrated in FIG. 9, the ring resonator 60 includes an annular waveguide core (single core). With the one end of the ring resonator 50 being optically coupled to the other end portions 54a, 55a, and 56a of the waveguide cores 54, 55, and 56, a directional coupler 61 is formed.

Meanwhile, the bus waveguide (second bus waveguide) 67 includes the three waveguide cores 64, 65, and 66, which extend along the same direction (Z-axis direction) and are disposed to be spaced apart at equal intervals in the X-axis direction. In a similar manner to the first embodiment, in order to excite the super mode, the waveguide cores 64, 65, and 66 are placed in proximity to one another to enable optical coupling between the adjacent waveguide cores of the waveguide cores 64, 65, and 66. Accordingly, evanescent light can propagate between the adjacent waveguide cores. One end portions 64a, 65a, and 66a of the waveguide cores 64, 65, and 66 are disposed to be optically coupled to the other end of the ring resonator 60. With this arrangement, a directional coupler 62 is formed by the other end of the ring resonator 60 and one end portions 64a, 65a, and 66a of the waveguide cores 64, 65, and 66.

Note that, although the core number of the waveguide cores 64 to 66 in the bus waveguide 67 is three in the present embodiment, no limitation thereto is intended. The configuration of the bus waveguide 67 can be changed appropriately to set the core number to K where K is an integer equal to or larger than two.

The other end portions 64b, 65b, and 66b of the waveguide cores 64, 65, and 66 in the bus waveguide 67 are disposed to be optically coupled to the light reflector 71. As illustrated in FIG. 9, the light reflector 71 includes the three mirrors 68, 69, and 70 that are optically coupled to the light input/output ends of the other end portions 64b, 65b, and 66b of the waveguide cores 64, 65, and 66. Those mirrors 68, 69, and 70 have a function to reflect light propagating through the respective waveguide cores 64, 65, and 66 toward the opposite direction. Such mirrors 68, 69, and 70 may be implemented by, for example, Bragg gratings, or may be implemented by cleavage facets of a crystal.

The heater 78 made of a high-resistance metal material is formed on the ring resonator 50, and the heater 79 made of a high-resistance metal material is formed on the ring resonator 60. Such heaters 78 and 79 can be formed by a high-resistance metal material such as tantalum, platinum, and titanium being evaporated, for example. By energizing the heaters 78 and 79 and individually controlling the temperatures of those heaters 78 and 79, a resonance wavelength changes by Vernier effect (refractive index change) of the two ring resonators 50 and 60. Accordingly, tunable wavelength control can be achieved.

Each of the multi-core waveguide 47 and the bus waveguides 57 and 67 coupled to the ring resonators 50 and 60 functions as a coupling waveguide including three waveguide cores. Accordingly, by selecting a waveguide parameter to achieve phase matching between a propagation mode of the ring resonators 50 and 60, and the phases of a 0-th-order super mode propagating in the multi-core waveguide 47 and bus waveguides 57 and 67, the set of the multi-core waveguide 47 and bus waveguides 57 and 67 and the pair of the ring resonators 50 and 60 are optically coupled to each other, and thus, a resonator can be formed as a whole.

Here, the three waveguide cores (e.g., waveguide cores 44 to 46) included in the coupling waveguide are to be called a "core A", and the waveguide included in the ring resonator (e.g., ring resonator 50) is to be called a "core B". As illustrated in FIG. 10, in a similar manner to the case of the first embodiment, the core A has a core width $w_1$, a height h, and an interval $a_1$. On the other hand, a core width $w_2$ of the core B needs to be determined in such a manner that the phase is matched with the 0-th-order super mode that is the propagation mode of the coupling waveguide including the three waveguide cores.

Figure 11:
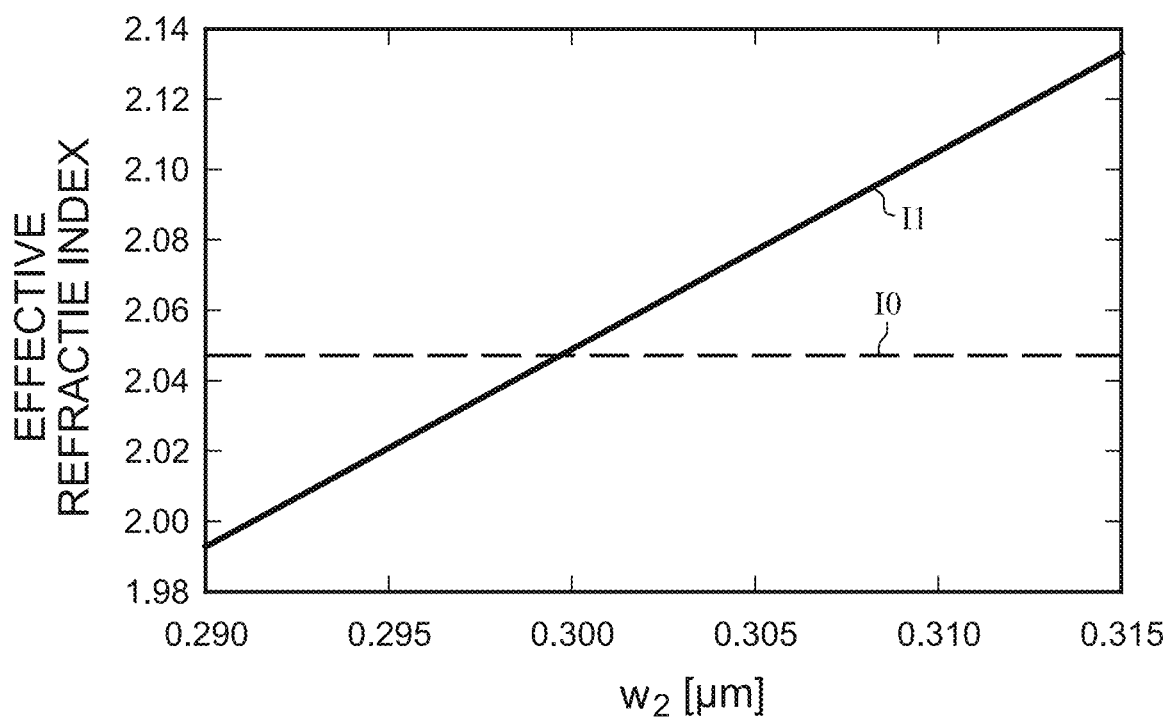
FIG. 11 is a graph illustrating dependence of an effective refractive index of a propagation mode on a core width.

FIG. 11 is a graph illustrating dependence of an effective refractive index I1 of the propagation mode on the core width $w_2$, which is calculated on the assumption that only the core B exists. An effective refractive index with respect to the 0-th-order super mode (FIG. 5) of the core A is indicated by a broken line I0 for reference. When $w_2$=299 nm, it can be confirmed that a phase matching condition is satisfied. Here, since the effective refractive index of the 0-th-order super mode with three waveguide cores is larger than the effective refractive index of the fundamental mode with respect to one waveguide core in general, it should be noted that a relationship of $w_2>w_1$ is established. However, this is not the case when the branch waveguide is designed to excite a higher-order super mode instead of the 0-th-order super mode.

Figure 12:
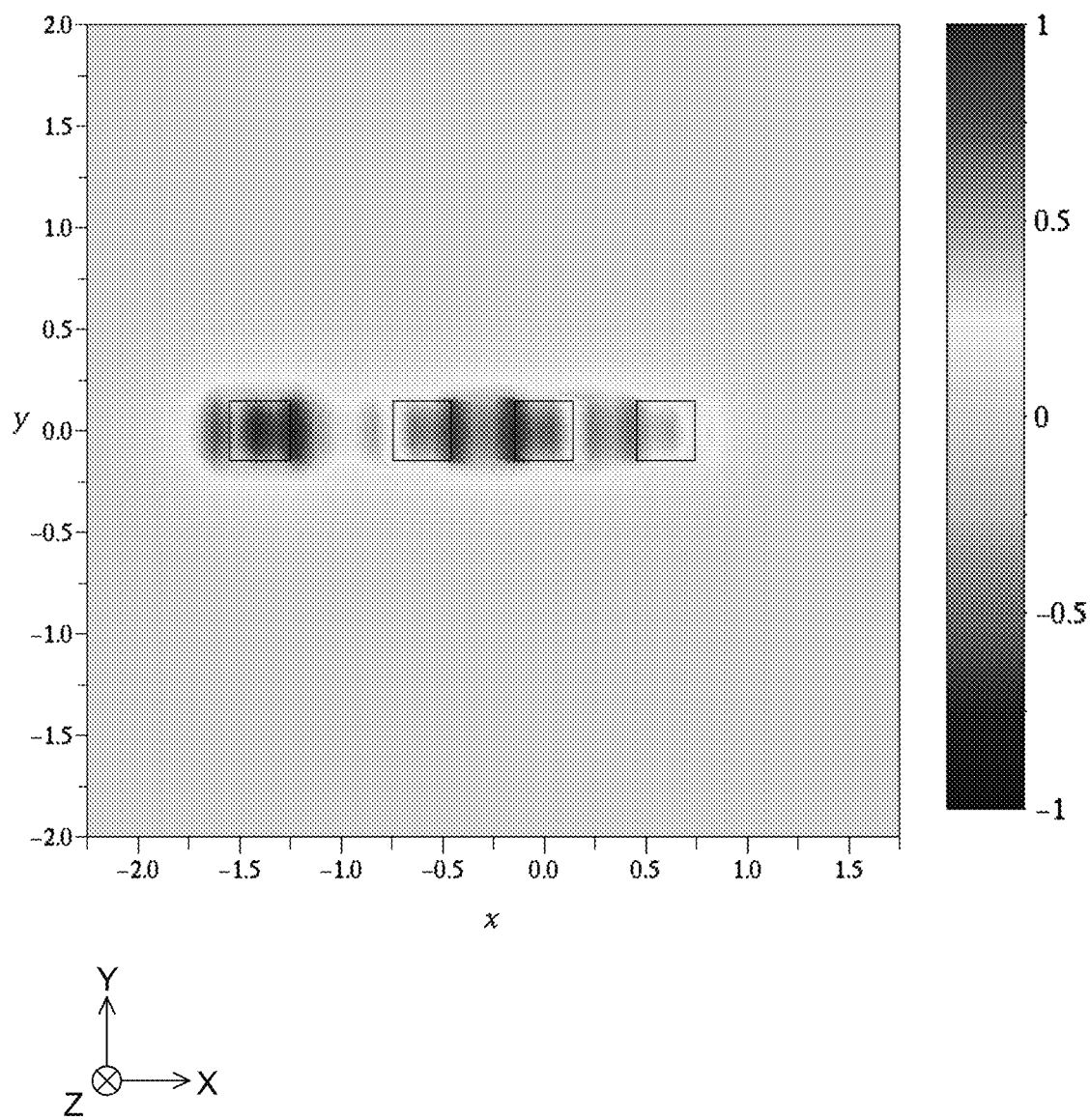
FIG. 12 is a diagram illustrating an exemplary result of a calculation for a super mode.
Figure 13:
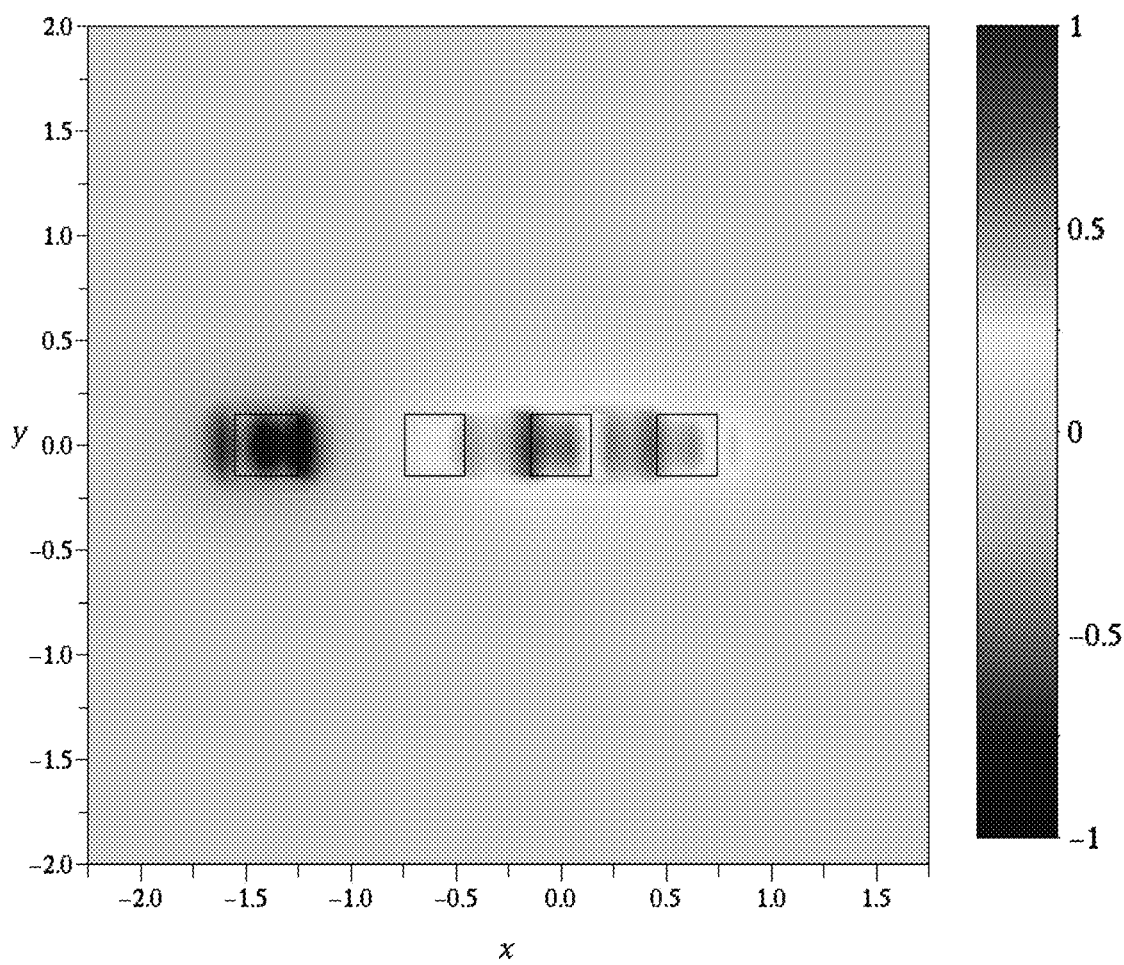
FIG. 13 is a diagram illustrating another exemplary result of a calculation for a super mode.

Under such conditions, calculation results of two super modes in a case where a core interval between the core A and the core B is set to $a_2$=800 nm, for example, are each illustrated in FIGS. 12 and 13. Here, in FIG. 12, a value of an x-direction component of the core B appearing on the left side indicates a positive value, and values of x-direction components of the three cores A appearing on the right side also indicate positive values. Meanwhile, in FIG. 13, a value of the x-direction component of the core B appearing on the left side indicates a negative value, whereas values of the x-direction components of the three cores A appearing on the right side indicate positive values. Assuming that the effective refractive index in the super mode illustrated in FIG. 12 is $n_e$ and the effective refractive index illustrated in FIG. 13 is $n_o$, a coupling length $L_c$ that is a propagation length at which the super mode of the core A completely shifts to the core B can be calculated using the following formula (1) from the beat of those super modes.

$$L_c=\lambda/\{2(n_e-n_o)\}. \quad (1)$$

Figure 14:
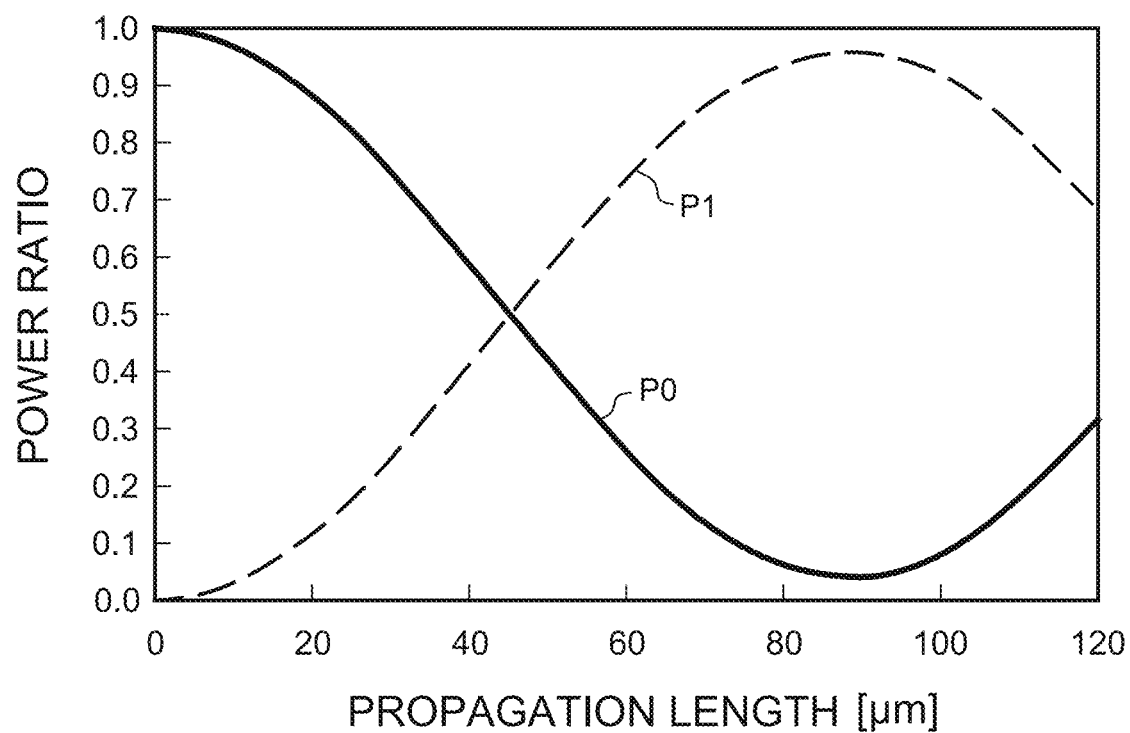
FIG. 14 is a graph illustrating a result of a calculation of a change with respect to propagation of optical power.

Here, it can be calculated that the effective refractive index $n_e$ is approximately 2.051597 and the effective refractive index $n_o$ is approximately 2.042803, and thus, the coupling length $L_c$ can be estimated to be approximately 88 μm. In order to confirm this, a result P0 obtained by calculating a change in optical power input to the core A with respect to propagation is illustrated in FIG. 14. A beam propagation method based on a vector finite element scheme disclosed in Non-Patent Literature 4 set out below was used for the calculation of the result of FIG. 14.

Non-Patent Literature 4: K. Saitoh, and M. Koshiba, "Full-vectorial finite element beam propagation method with perfectly matched layers for anisotropic optical waveguides", IEEE/OSA J. Lightwave Technol. 19, 405 (2001).

Figure 15:
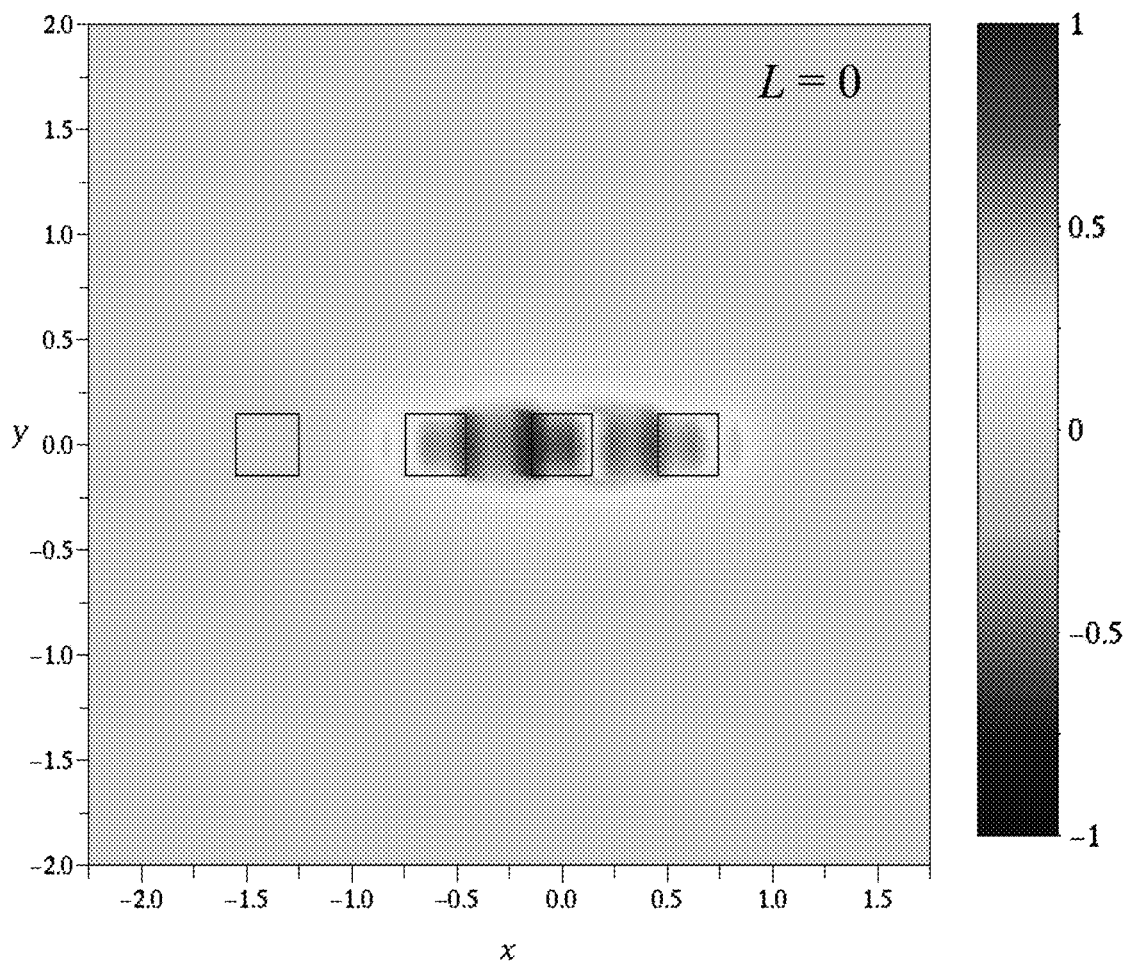
FIG. 15 is a diagram illustrating distribution of x-components of the electric field with respect to a propagation length L=0.
Figure 16:
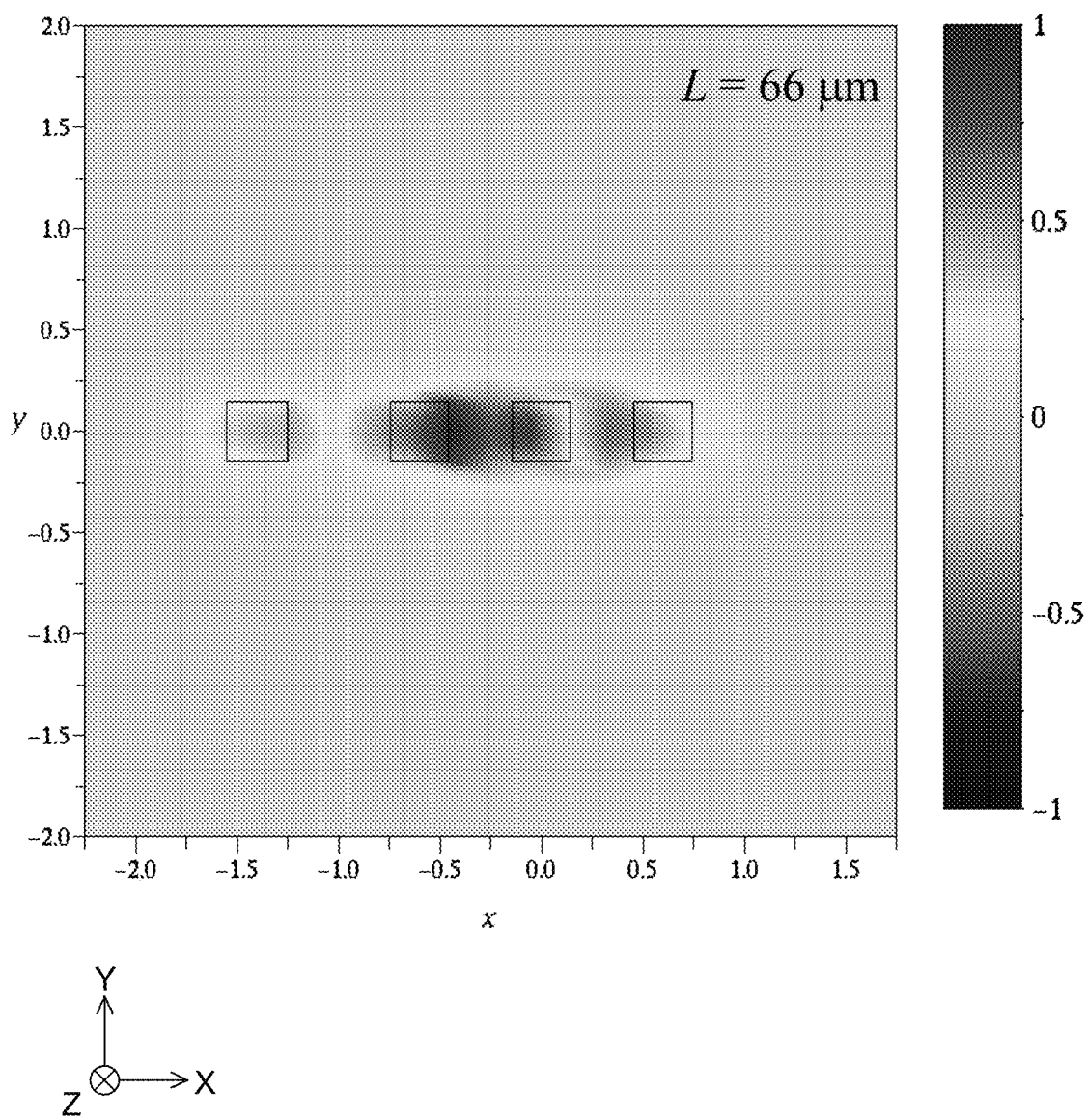
FIG. 16 is a diagram illustrating distribution of the x-components of the electric field with respect to the propagation length L=66 μm.
Figure 17:
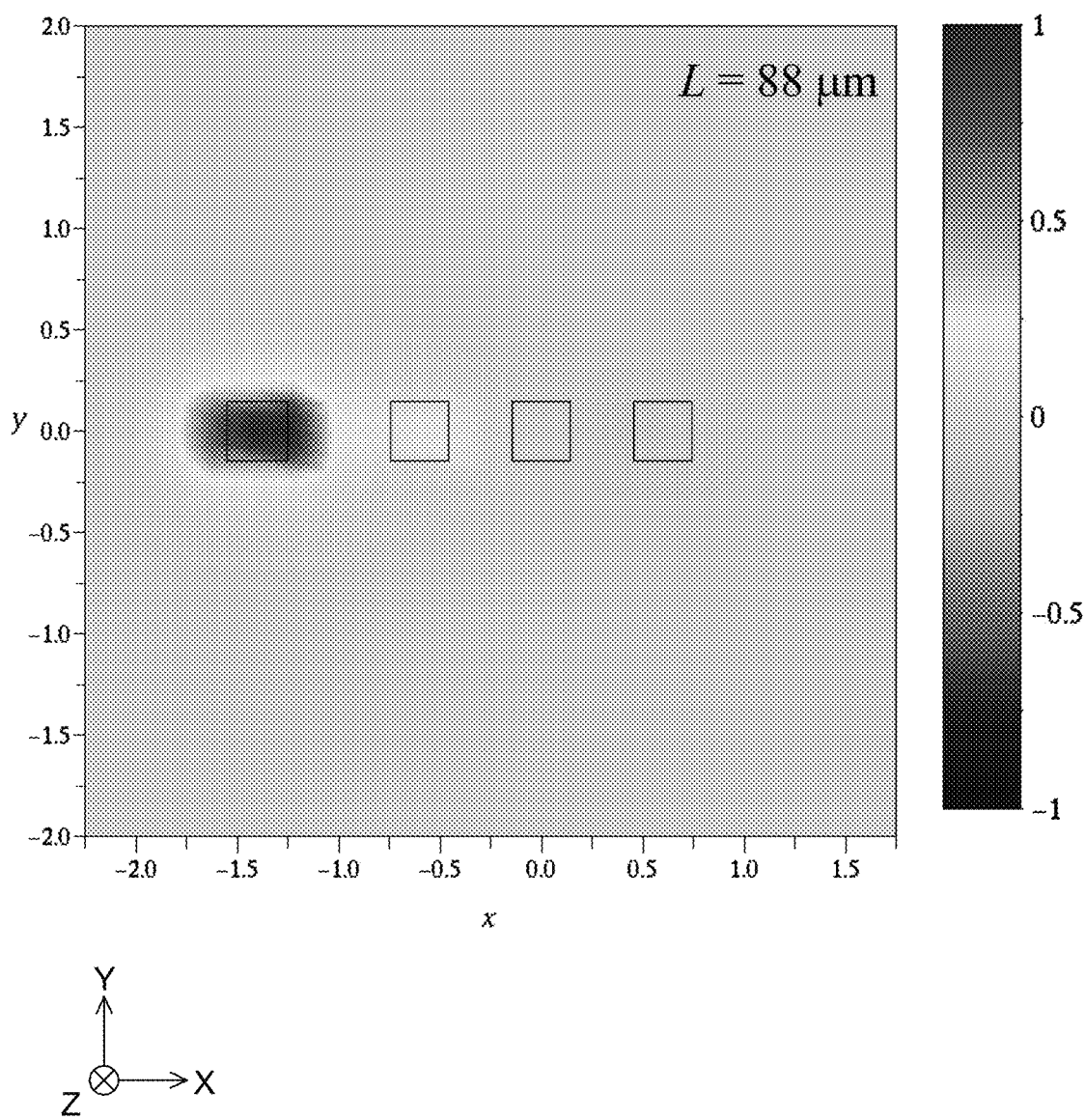
FIG. 17 is a diagram illustrating distribution of the x-components of the electric field with respect to the propagation length L=88 μm.

FIGS. 15, 16, and 17 illustrate, with regard to a propagation length L, distribution of the x-components of the electric field for cases of L=0, L=66 μm, and L=88 μm, respectively. The optical power input to the core A gradually shifts to the core B in accordance with the propagation, and it can be confirmed that the optical power has almost entirely shifted to the core B at the time when the coupling length $L_c$ is approximately 88 μm. Note that, as for the value of the coupling length $L_c$, in the case of designing the core interval $a_2$ to be a smaller value, a value of $n_e-n_o$ increases, and the coupling length $L_c$ further decreases. On the other hand, in the case of designing a value of the core interval $a_2$ to be a larger value, a value of $n_e-n_o$ decreases, and the coupling length $L_c$ further increases.

As described above, according to the third embodiment, an effect similar to that of the first embodiment can be exerted. In addition to that effect, tunable wavelength control is made possible. Since the phases of the coupling waveguides 47, 57, and 67 each including three waveguide cores and the cores included in the ring resonators 50 and 60 are matched, and the optical power can be shifted between those cores, the laser device 3 of the present embodiment can operate as a resonator as a whole even in the case of using the coupling waveguides 47, 57, and 67 each including the three waveguide cores.

Figure 18:
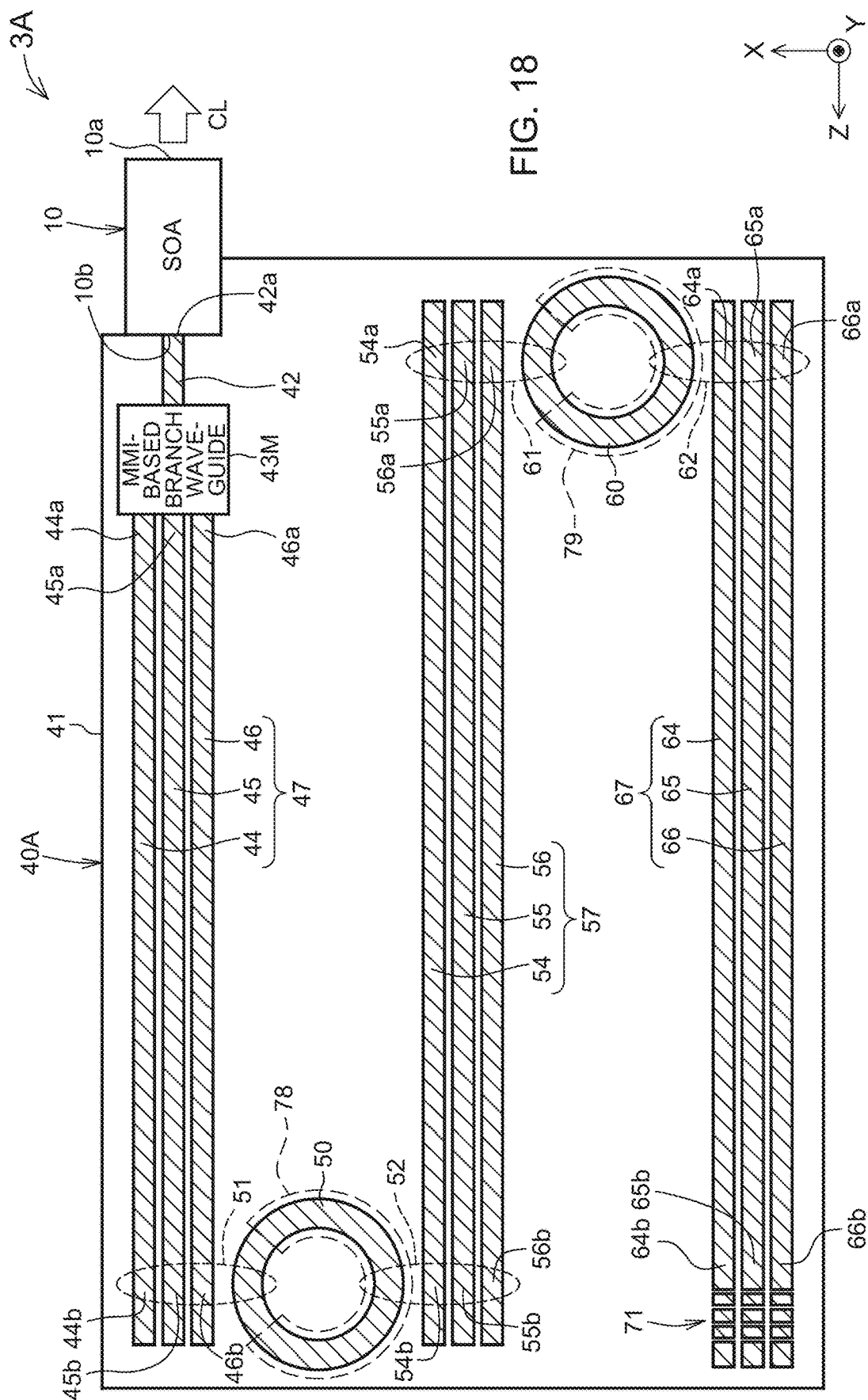
FIG. 18 is a plan view illustrating a schematic configuration of a laser device that is a first variation example of the third embodiment.

Next, a variation example of the third embodiment will be described. FIG. 18 is a plan view illustrating a schematic configuration of a laser device 3A of a first variation example of the third embodiment. The laser device 3A of the variation example includes an SOA 10, and an optical waveguide structure 40A. A configuration of the optical waveguide structure 40A of the variation example is the same as the configuration of the optical waveguide structure 40 of the third embodiment described above except that a multimode interference-based branch waveguide 43M in FIG. 18 is included instead of the branch waveguide 43 described above. Even in the case of the present embodiment, an effect similar to that of the third embodiment described above can be exerted.

Figure 19:
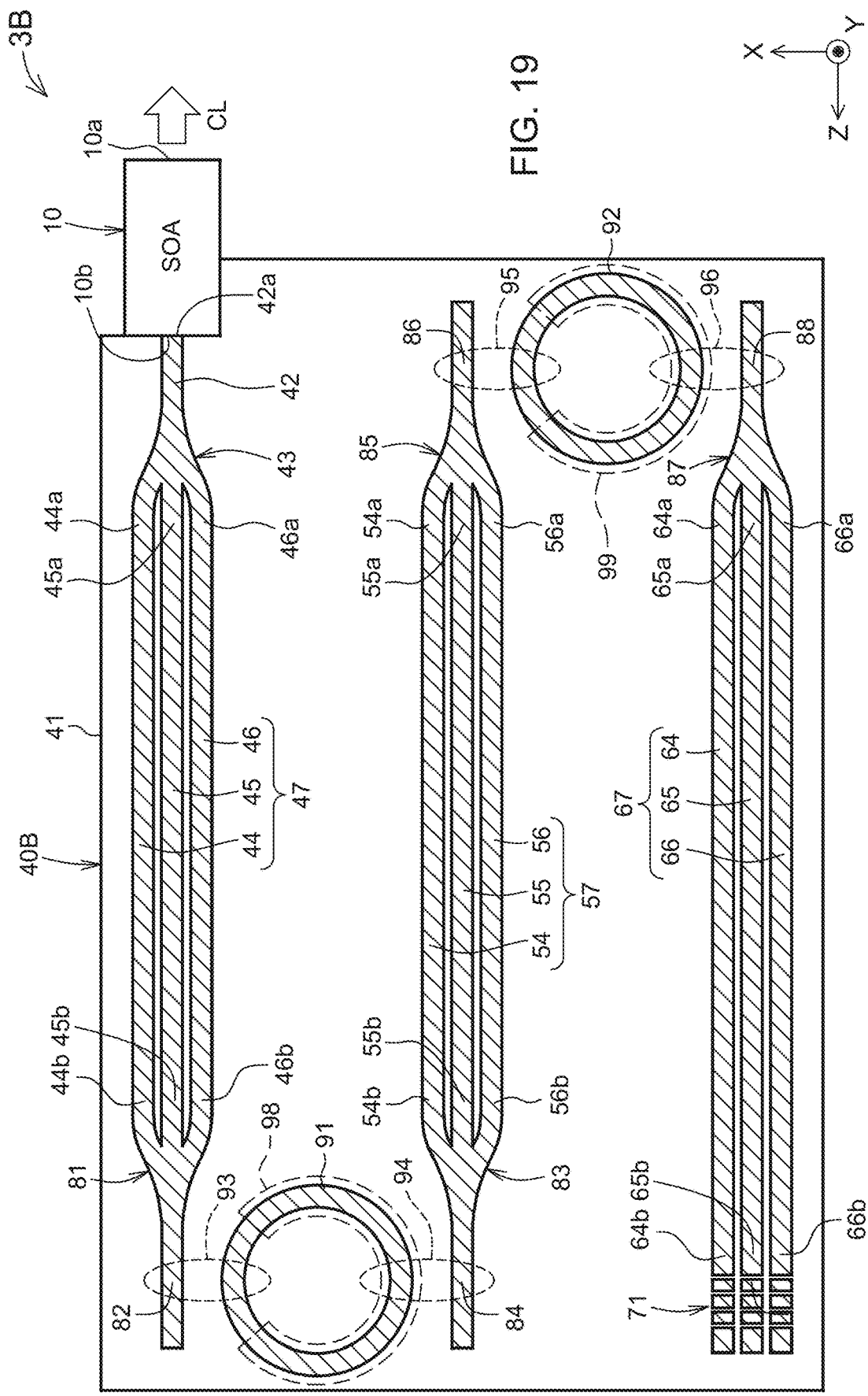
FIG. 19 is a plan view illustrating a schematic configuration of a laser device that is a second variation example of the third embodiment.

FIG. 19 is a plan view illustrating a schematic configuration of a laser device 3B that is a second variation example of the third embodiment. As illustrated in FIG. 19, the laser device 3B of the present embodiment includes an SOA 10, and an optical waveguide structure 40B. A configuration of the optical waveguide structure 40B is the same as the configuration of the optical waveguide structure 40 of the third embodiment except that intermediate branch waveguides 81, 83, 85, and 87, connecting waveguides 82, 84, 86, and 88, ring resonators 91 and 92, and heaters 98 and 99 in FIG. 19 are included instead of the ring resonators 50 and 60 and the heaters 78 and 79 of the third embodiment.

In the laser device 3B, a directional coupler 93 is formed by the connecting waveguide 82 and an end of the ring resonator 91, and a directional coupler 94 is formed by the connecting waveguide 84 and the other end of the ring resonator 91. Further, a directional coupler 95 is formed by the connecting waveguide 86 and an end of the ring resonator 92, and a directional coupler 96 is formed by the connecting waveguide 88 and the other end of the ring resonator 92. A method for manufacturing the optical waveguide structure 40B is similar to the method of manufacture according to the first embodiment.

As illustrated in FIG. 19, the intermediate branch waveguide (first intermediate branch waveguide) 81 is interposed between the multi-core waveguide 47 and the ring resonator 91, and is optically coupled to light input/output ends of end portions 44b, 45b, and 46b of waveguide cores 44 to 46. The intermediate branch waveguide (first intermediate branch waveguide) 81 combines three light beams input from the waveguide cores 44 to 46 to generate composite light. In the directional coupler 93, the connecting waveguide 82 can feed the composite light input from the intermediate branch waveguide 81 into one end of the ring resonator 91. In an opposite manner, the connecting waveguide 82 feed light input from the one end of the ring resonator 91 into the intermediate branch waveguide 81. The intermediate branch waveguide 81 can split light input from the connecting waveguide 82 into three light beams, and can feed the three light beams into the waveguide cores 44 to 46.

In the directional coupler 94, the connecting waveguide (second connecting waveguide) 84 outputs the light propagating from the other end of the ring resonator 91, to the intermediate branch waveguide 83. The intermediate branch waveguide (second intermediate branch waveguide) 83 is interposed between the bus waveguide 57 and the ring resonator 91, and is optically coupled to light input/output ends of end portions 54*b*, 55*b*, and 56*b* of waveguide cores 54 to 56. The intermediate branch waveguide 83 can split light input from the other end of the ring resonator 91 through the connecting waveguide 84 into three light beams, and can feed the three light beams into the waveguide cores 54 to 56, respectively. In an opposite manner, the intermediate branch waveguide 83 can combine the three light beams input from the end portions 54*b*, 55*b*, and 56*b* of the waveguide cores 54 to 56 to generate composite light, and can feed the composite light into the ring resonator 91 through the connecting waveguide 84.

Meanwhile, the intermediate branch waveguide (third intermediate branch waveguide) 85 is interposed between the bus waveguide 57 and the ring resonator 92, and is optically coupled to light input/output ends of end portions 54*a*, 55*a*, and 56*a* of the waveguide cores 54 to 56. The intermediate branch waveguide 85 combines the three light beams input from the waveguide cores 54 to 56 to generate composite light. In the directional coupler 95, the connecting waveguide (third connecting waveguide) 86 can feed the composite light input from the intermediate branch waveguide 85 into one end of the ring resonator 92. In an opposite manner, the connecting waveguide 86 feeds light input from the one end of the ring resonator 92 into the intermediate branch waveguide 85. The intermediate branch waveguide 85 can split light input from the connecting waveguide 86 into three light beams, and can feed the three light beams into the waveguide cores 54 to 56, respectively.

In the directional coupler 96, the connecting waveguide (fourth connecting waveguide) 88 outputs the light propagating from the other end of the ring resonator 92, to the intermediate branch waveguide 87. The intermediate branch waveguide (fourth intermediate branch waveguide) 87 is interposed between a bus waveguide 67 and the ring resonator 92, and is optically coupled to light input/output ends of end portions 64*a*, 65*a*, and 66*a* of waveguide cores 64 to 66. The intermediate branch waveguide 87 can split light input from the other end of the ring resonator 92 through the connecting waveguide 88 into three light beams, and can feed the three light beams into the waveguide cores 64 to 66, respectively. In an opposite manner, the intermediate branch waveguide 87 can combine the three light beams input from the end portions 64*a*, 65*a*, and 66*a* of the waveguide cores 64 to 66 to generate composite light, and can feed the composite light into the ring resonator 92 through the connecting waveguide 88.

Fourth Embodiment

Figure 20:
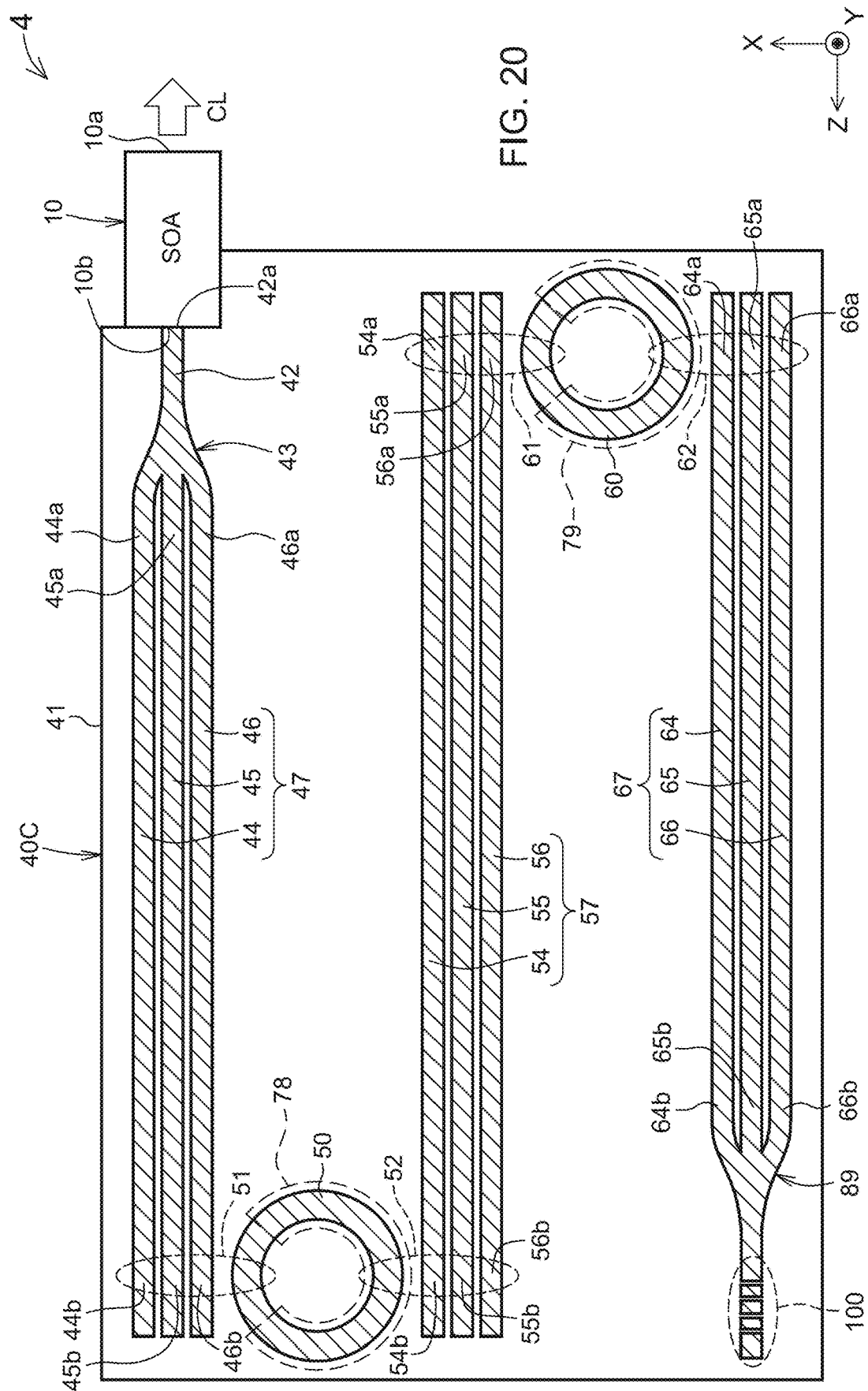
FIG. 20 is a plan view illustrating a schematic configuration of a laser device of a fourth embodiment of the present invention.

FIG. 20 is a plan view illustrating a schematic configuration of a laser device 4 of a fourth embodiment of the present invention. As illustrated in FIG. 20, the laser device 4 of the present embodiment includes an SOA 10, and an optical waveguide structure 40C. A configuration of the optical waveguide structure 40C is the same as the configuration of the optical waveguide structure 40 of the third embodiment except that a branch waveguide (back-end branch waveguide) 89 and a light reflector 100 in FIG. 20 are included instead of the light reflector 71 of the third embodiment.

A method for manufacturing the optical waveguide structure 40C is similar to the method for manufacturing the optical waveguide structure 20 of the first embodiment. The light reflector 100 may be implemented by, for example, Bragg gratings, or may be implemented by a cleaved facet of a crystal.

The branch waveguide 89 of the present embodiment is interposed between a bus waveguide 67 and the light reflector 100, and includes a single light input/output end optically coupled to the light reflector 100, and three branch ends optically coupled to the light input/output ends of end portions 64*b*, 65*b*, and 66*b* of waveguide cores 64 to 66. The branch waveguide 89 can combine three light beams propagating from the respective waveguide cores 64 to 66 to generate composite light, and can output the composite light to the light reflector 100. Furthermore, the branch waveguide 89 can split light reflected by the light reflector 100 into three light beams, and can feed the three light beams into the waveguide cores 64 to 66.

As described above, since the branch waveguide 89 has a function similar to that of the branch waveguide 38 of the second embodiment, a 0-th-order super mode propagating through the waveguide cores 64 to 66 can be converted into a fundamental mode propagating through one waveguide core to apply the fundamental mode to the light reflector 100 in a similar manner to the second embodiment. Therefore, according to the fourth embodiment, in addition to an effect similar to that in the third embodiment, it becomes possible to suppress light loss caused by a phase deviation between a plurality of waveguide cores in mirror reflection in a similar manner to the case of the second embodiment.

Figure 21:
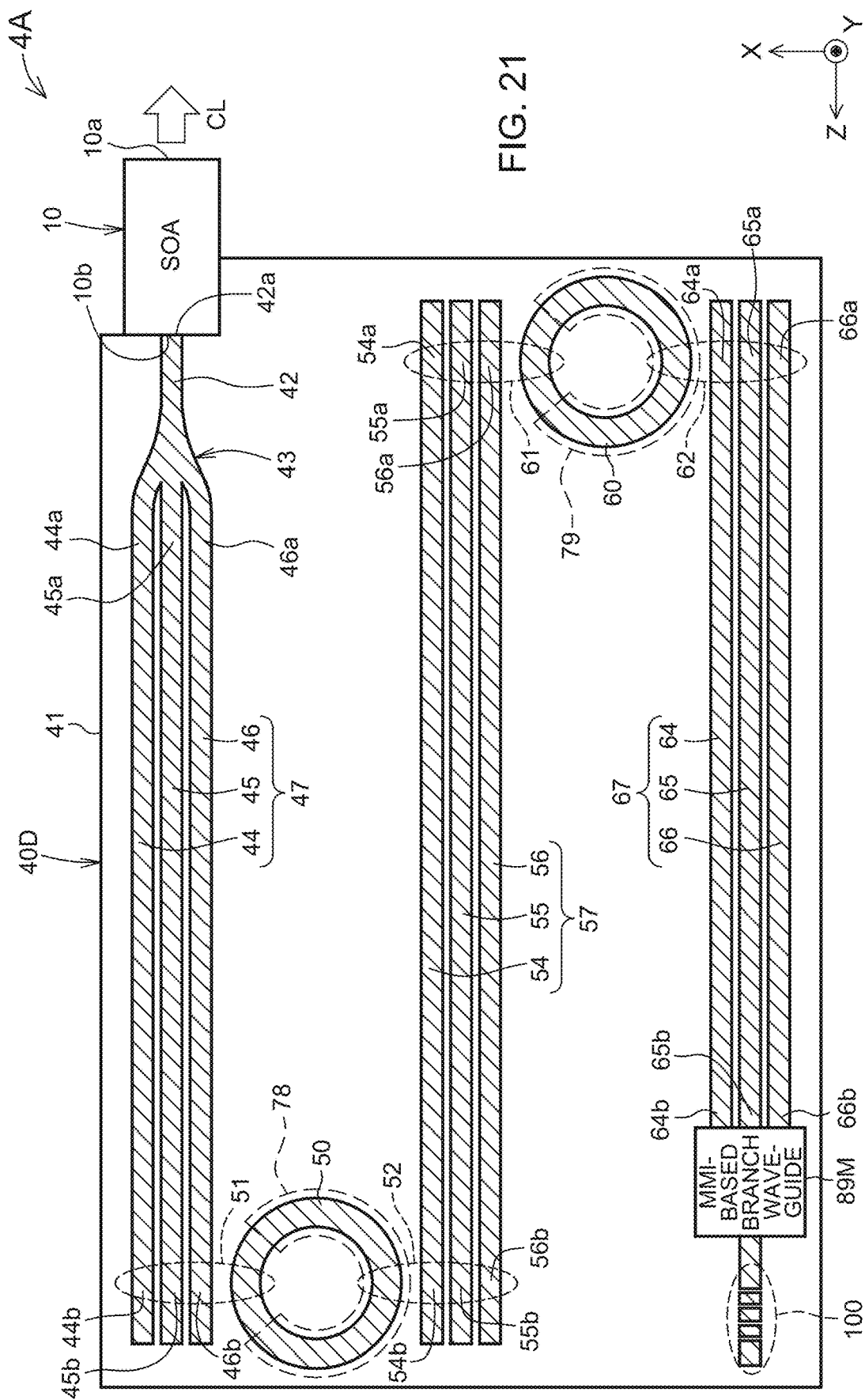
FIG. 21 is a plan view illustrating a schematic configuration of a laser device that is a variation example of the fourth embodiment.

FIG. 21 is a plan view illustrating a schematic configuration of a laser device 4A that is a variation example of the fourth embodiment. The laser device 4A of the variation example includes an SOA 10, and an optical waveguide structure 40D. A configuration of the optical waveguide structure 40D of the variation example is the same as the configuration of the optical waveguide structure 40C of the fourth embodiment described above except that a multimode interference-based branch waveguide 89M in FIG. 21 is included instead of the branch waveguide (back-end branch waveguide) 89 described above. Even in the case of the present variation example, an effect similar to that of the fourth embodiment described above can be exerted.

Fifth Embodiment

Figure 22:
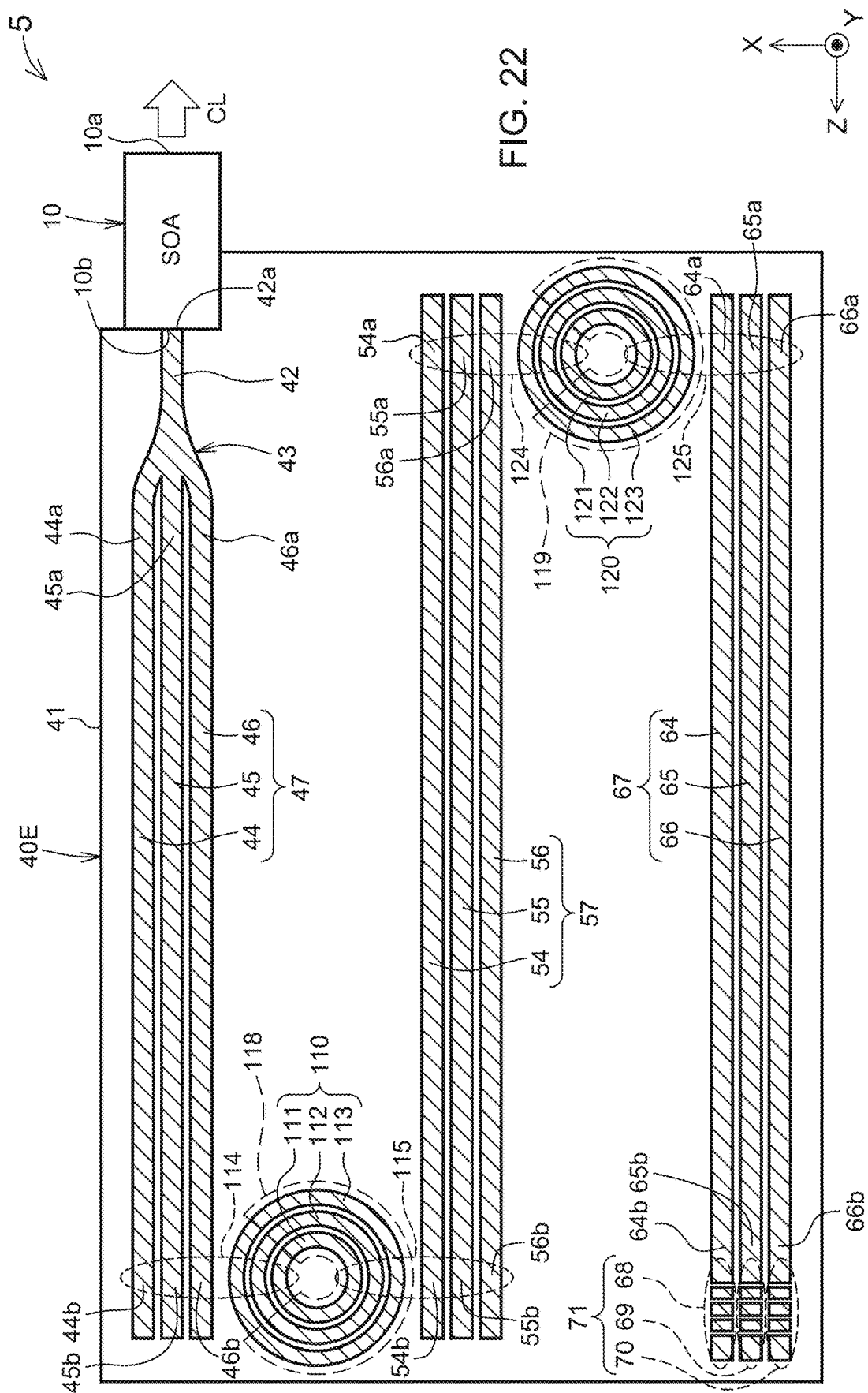
FIG. 22 is a plan view illustrating a schematic configuration of a laser device of a fifth embodiment of the present invention.

FIG. 22 is a plan view illustrating a schematic configuration of a laser device 5 of a fifth embodiment of the present invention. As illustrated in FIG. 22, the laser device 5 of the present embodiment includes an SOA 10, and an optical waveguide structure 40E. A configuration of the optical waveguide structure 40E is the same as the configuration of the optical waveguide structure 40 of the third embodiment except that multiple ring resonators 110 and 120 and heaters 118 and 119 in FIG. 22 are included instead of the ring resonators 50 and 60 and the heaters 78 and 79 of the third embodiment.

The multiple ring resonator (first ring resonator) 110 includes three ring-shaped waveguide cores 111, 112, and 113 concentrically disposed. In order to excite a super mode, the ring-shaped waveguide cores 111, 112, and 113 are placed in proximity to one another to enable optical coupling between the adjacent ring-shaped waveguide cores of the ring-shaped waveguide cores 111, 112, and 113. Accordingly, evanescent light can propagate between the adjacent ring-shaped waveguide cores. In addition, in order to achieve tunable wavelength control, the heater 118 made of a high-resistance metal material is provided on the multiple ring resonator 110. A directional coupler 114 is formed by one end of such a multiple ring resonator 110 and end portions 44b, 45b, and 46b of waveguide cores 44 to 46 of a multi-core waveguide 47, and a directional coupler 115 is formed by the other end of the multiple ring resonator 110 and end portions 54b, 55b, and 56b of waveguide cores 54 to 56 of a bus waveguide 57.

Note that, although the core number of the ring-shaped waveguide cores 111 to 113 in the multiple ring resonator 110 is three, no limitation thereto is intended. The configuration of the multiple ring resonator 110 can be changed appropriately to set the core number to L where L is an integer equal to or larger than two.

Meanwhile, the multiple ring resonator (second ring resonator) 120 includes three ring-shaped waveguide cores 121, 122, and 123 concentrically disposed. In order to excite the super mode, the ring-shaped waveguide cores 121, 122, and 123 are placed in proximity to one another to enable optical coupling between the adjacent ring-shaped waveguide cores of the ring-shaped waveguide cores 121, 122, and 123. Accordingly, evanescent light can propagate between the adjacent ring-shaped waveguide cores. In addition, in order to achieve tunable wavelength control, the heater 119 made of a high-resistance metal material is provided on the multiple ring resonator 120. A directional coupler 124 is formed by one end of such a multiple ring resonator 120 and end portions 54a, 55a, and 56a of the waveguide cores 54 to 56 of the bus waveguide 57, and a directional coupler 125 is formed by the other end of the multiple ring resonator 120 and end portions 64a, 65a, and 66a of waveguide cores 64 to 66 of a bus waveguide 67.

Note that, although the core number of the ring-shaped waveguide cores 121 to 123 in the multiple ring resonator 120 is three, no limitation thereto is intended. The configuration of the multiple ring resonator 120 can be changed appropriately to set the core number to P where P is an integer equal to or larger than two.

As described above, in the fifth embodiment, the multiple ring resonators 110 and 120 are configured to excite the super mode. Therefore, when a phase matching condition for the super mode of the multi-core waveguide 47 and the bus waveguides 57 and 67 is satisfied according to a design method similar to that of the third embodiment, the laser device 5 can operate as a resonator as a whole. Therefore, an effective core cross-sectional area can be enlarged for the coupling waveguide in the multiple ring resonators 110 and 120 in addition to the effect of the third embodiment, and thus, a non-linear optical effect can be suppressed at the time of high optical output power. Therefore, stabilization of the output wavelength can be achieved.

Figure 23:
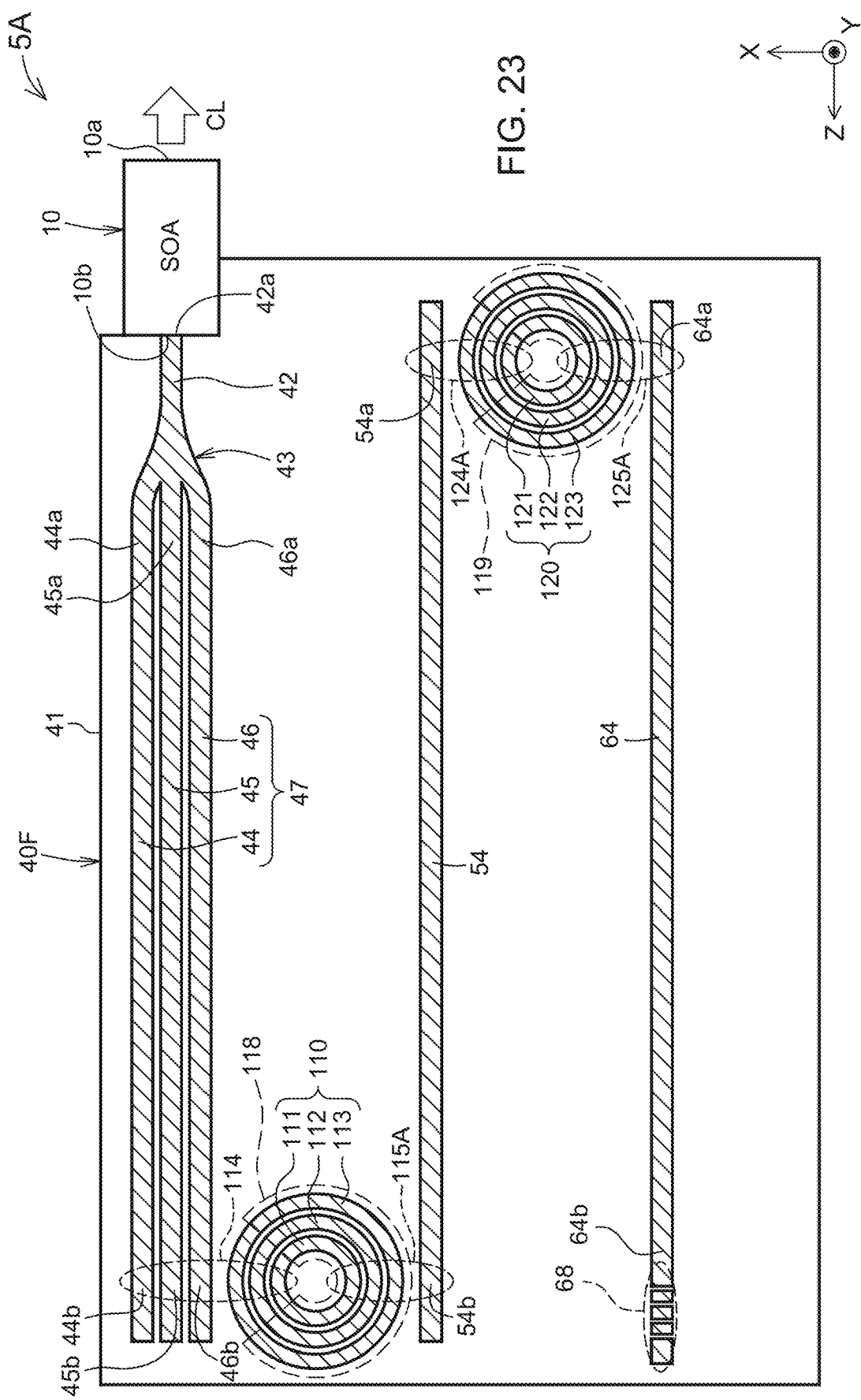
FIG. 23 is a plan view illustrating a schematic configuration of a laser device that is a variation example of the fifth embodiment.

FIG. 23 is a plan view illustrating a schematic configuration of a laser device 5A that is a variation example of the fifth embodiment. The laser device 5A of the variation example includes an SOA 10, and an optical waveguide structure 40F. A configuration of the optical waveguide structure 40F of the variation example is the same as the configuration of the optical waveguide structure 40E of the fifth embodiment described above except that waveguide cores (single cores) 54 and 64 in FIG. 23 are included instead of the bus waveguides 57 and 67 described above. In the variation example, a directional coupler 115A is formed by the other end of the multiple ring resonator (first ring resonator) 110 and the end portion 54b of the waveguide core 54. In addition, a directional coupler 124A is formed by one end of the multiple ring resonator (second ring resonator) 120 and the end portion 54a of the waveguide core 54, and a directional coupler 125A is formed by the other end of the multiple ring resonator 120 and the end portion 64a of the waveguide core 64.

In the present variation example as well, the super mode is excited by the multi-core waveguide 47 and the multiple ring resonators 110 and 120, and thus, the non-linear optical effect can be suppressed at the time of high optical output power. Therefore, stabilization of the output wavelength can be achieved.

Sixth Embodiment

Figure 24:
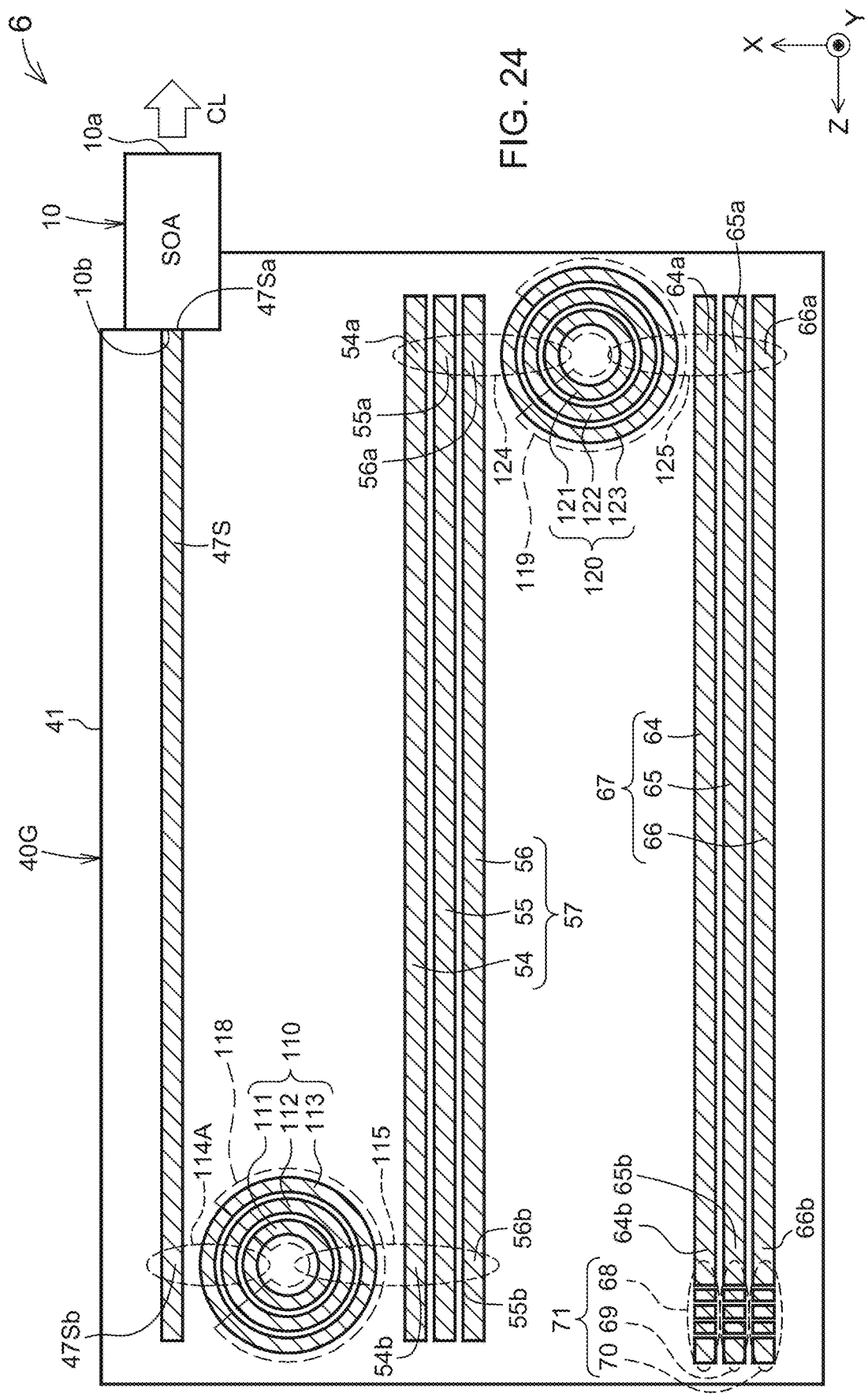
FIG. 24 is a plan view illustrating a schematic configuration of a laser device of a sixth embodiment of the present invention.

FIG. 24 is a plan view illustrating a schematic configuration of a laser device 6 of a sixth embodiment of the present invention. As illustrated in FIG. 24, the laser device 6 of the present embodiment includes an SOA 10, and an optical waveguide structure 40G. A configuration of the optical waveguide structure 40G is the same as the configuration of the optical waveguide structure 40E of the fifth embodiment except that an input/output waveguide 47S in FIG. 24 is included instead of the input/output waveguide 42 and the multi-core waveguide 47 of the fifth embodiment.

The input/output waveguide 47S includes a single waveguide core (single core) as illustrated in FIG. 24, and includes a light input/output end 47Sa optically coupled to a light input/output end face 10b of the SOA 10. The SOA 10 can input light to the optical waveguide structure 40G through the light input/output end face (back-end face) 10b. In the present embodiment, a directional coupler 114A is formed by one end of a multiple ring resonator (first ring resonator) 110 and an end 47Sb of the input/output waveguide 47S.

In the present embodiment as well, a super mode is excited by the multiple ring resonators 110 and 120, and thus, a non-linear optical effect can be suppressed at the time of high optical output power. Therefore, stabilization of the output wavelength can be achieved.

FIG. 25 is a plan view illustrating a schematic configuration of a laser device 6A that is a variation example of the sixth embodiment. The laser device 6A of the variation example includes an SOA 10, and an optical waveguide structure 40H. A configuration of the optical waveguide structure 40H of the variation example is the same as the configuration of the optical waveguide structure 40G of the sixth embodiment described above except that waveguide cores (single cores) 54 and 64 in FIG. 25 are included instead of the bus waveguides 57 and 67 described above. In the variation example, a directional coupler 115A is formed by the other end of the multiple ring resonator (first ring resonator) 110 and the end portion 54b of the waveguide core 54. In addition, a directional coupler 124A is formed by one end of the multiple ring resonator (second ring resonator) 120 and the end portion 54a of the waveguide core 54, and a directional coupler 125A is formed by the other end of the multiple ring resonator 120 and the end portion 64a of the waveguide core 64.

In the present variation example as well, a super mode is excited by the multiple ring resonators 110 and 120, and thus, a non-linear optical effect can be suppressed at the time of high optical output power. Therefore, stabilization of the output wavelength can be achieved.

Although various embodiments of the present invention have been described above with reference to the accompanying drawings, those embodiments are merely examples of the present invention, and various embodiments other than the above-described embodiments can be utilized. For example, although the number of waveguide cores of the coupling waveguide of each of the first to sixth embodiments as described above is the same, no limitation thereto is intended. It is not required to set the number of waveguide cores of the coupling waveguide to be all the same as long as a phase matching condition is satisfied.

Further, although the optical waveguide structure according to each of the first to sixth embodiments described above includes an embedded waveguide, no limitation thereto is intended. A ridge waveguide or a high mesa waveguide may be used instead of the embedded waveguide.

It should be noted that, within the scope of the present invention, the first to sixth embodiments as described above can be freely combined, any component of each embodiment can be modified, or any component of each embodiment can be omitted.

INDUSTRIAL APPLICABILITY

A laser device according to the present invention is suitable for use in optical communication technology in a communication network such as a middle-distance metro network and a data center network.

REFERENCE SIGNS LIST 1, 1A, 2, 2A, 3, 3A, 3B, 4, 4A, 5, 6, 6A: laser devices; 10: a semiconductor optical amplifier (SOA); 20, 20A, 20B, 20C: optical waveguide structures; 21: a semiconductor substrate layer; 22: an input/output waveguide; 23: a branch waveguide; 23M: a multimode interference (MMI)-based branch waveguide (back-end branch waveguide); 24 to 26: waveguide cores; 27: a multi-core waveguide (coupling waveguide); 28 to 30: mirrors; 31: a light reflector; 33: a cladding layer; 38: a branch waveguide (back-end branch waveguide); 39: a light reflector; 40, 40A to 40H: optical waveguide structures; 41: a semiconductor substrate layer; 42: an input/output waveguide; 43: a branch waveguide; 43M: an MMI-based branch waveguide (back-end branch waveguide); 44 to 46: waveguide cores; 47: a multi-core waveguide (coupling waveguide); 47S: an input/output waveguide or a waveguide core (single core); 50: a ring resonator; 51, 52: directional couplers; 53: a cladding layer; 54 to 56: waveguide cores; 57: a bus waveguide (coupling waveguide); 60: a ring resonator; 61, 62: directional couplers; 64 to 66: waveguide cores; 67: a bus waveguide (coupling waveguide); 68 to 70: mirrors; 71: a light reflector; 78, 79: heaters; 81, 83, 85, 87: intermediate branch waveguides; 89: a branch waveguide (back-end branch waveguide); 89M: an MMI-based branch waveguide (back-end branch waveguide); 82, 84, 86, 88: connecting waveguides; 91, 92: ring resonators; 93 to 96: directional couplers; 98, 99: heaters; 100: a light reflector; 110, 120: multiple ring resonators (coupling waveguides); 111 to 113, 121 to 123: ring-shaped waveguide cores; 114, 115: directional couplers; 118, 119: heaters; and 124, 125: directional couplers.

The invention claimed is:

1. A laser device comprising:
an optical amplifier;
a branch waveguide having N branch ends and a light input/output end that is optically coupled to the optical amplifier where N is an integer equal to or larger than two, the branch waveguide being configured to split light propagating from the optical amplifier into N light beams and output the N light beams from the N branch ends, respectively;
a multi-core waveguide having a first light input/output end that is optically coupled to the N branch ends of the branch waveguide, and having N waveguide cores configured to carry the N light beams input from the branch waveguide, respectively; and
a light reflector optically coupled to a second light input/output end of the multi-core waveguide, wherein
the N waveguide cores are placed in proximity to one another to enable optical coupling between adjacent waveguide cores of the N waveguide cores.

2. The laser device according to claim 1, wherein the N waveguide cores are placed in proximity to one another to enable propagation of evanescent light between adjacent waveguide cores of the N waveguide cores.

3. The laser device according to claim 1, further comprising a back-end branch waveguide interposed between the multi-core waveguide and the light reflector and optically coupled to the second light input/output end of the multi-core waveguide, wherein
the back-end branch waveguide is configured to combine the N light beams propagating from the N waveguide cores respectively to generate composite light, output the generated composite light to the light reflector, and split light reflected by the light reflector into N reflected light beams to feed the N reflected light beams into the N waveguide cores, respectively.

4. The laser device according to claim 3, wherein the back-end branch waveguide includes a multimode interference-based branch waveguide.

5. The laser device according to claim 1, wherein the branch waveguide includes a multimode interference-based branch waveguide.

6. A laser device comprising:
an optical amplifier;
a branch waveguide having N branch ends and a light input/output end that is optically coupled to the optical amplifier where N is an integer equal to or larger than two, the branch waveguide being configured to split light propagating from the optical amplifier into N light beams and output the N light beams from the N branch ends, respectively;
a multi-core waveguide having a first light input/output end that is optically coupled to the N branch ends of the branch waveguide, and having N waveguide cores configured to carry the N light beams input from the N branch ends of the branch waveguide;
a first ring resonator having a first end that is optically coupled to a portion of the multi-core waveguide;
a first bus waveguide optically coupled to a second end of the first ring resonator, and configured to carry light input from the second end of the first ring resonator;
a second ring resonator having a first end that is optically coupled to a portion of the first bus waveguide;
a second bus waveguide optically coupled to a second end of the second ring resonator, and configured to carry light input from the second end of the second ring resonator; and
a light reflector optically coupled to a light input/output end of the second bus waveguide, wherein
the N waveguide cores are placed in proximity to one another to enable optical coupling between adjacent waveguide cores of the N waveguide cores.

7. The laser device according to claim 6, wherein the branch waveguide includes a multimode interference-based branch waveguide.

8. The laser device according to claim 6, wherein:
the first bus waveguide includes M waveguide cores where M is an integer of equal to or more than two, each waveguide core being optically coupled to the second end of the first ring resonator and configured to carry light input from the second end of the first ring resonator; and
the M waveguide cores are placed in proximity to one another to enable optical coupling between adjacent waveguide cores of the M waveguide cores.

9. The laser device according to claim 8, further comprising:
a first intermediate branch waveguide interposed between the multi-core waveguide and the first ring resonator to optically coupled to a different light input/output end of the multi-core waveguide, and configured to combine the N light beams input from the N waveguide cores to generate composite light;
a first connecting waveguide optically coupled to the first end of the first ring resonator and configured to feed the composite light input from the first intermediate branch waveguide into the first ring resonator;
a second connecting waveguide interposed between the first ring resonator and the first bus waveguide and optically coupled to the second end of the first ring resonator; and
a second intermediate branch waveguide configured to split, into M light beams, light input from the second end of the first ring resonator through the second connecting waveguide and feed the M light beams into the M waveguide cores.

10. The laser device according to claim 6, wherein:
the second bus waveguide includes K waveguide cores where K is an integer equal to or larger than two, each waveguide core being optically coupled to the second end of the second ring resonator and configured to carry light input from the second end of the second ring resonator; and
the K waveguide cores are placed in proximity to one another to enable optical coupling between adjacent waveguide cores of the K waveguide cores.

11. The laser device according to claim 10, further comprising a back-end branch waveguide interposed between the second bus waveguide and the light reflector and optically coupled to the light input/output end of the second bus waveguide, wherein
the back-end branch waveguide is configured to combine the K light beams propagating from the K waveguide cores respectively to generate composite light, output the generated composite light to the light reflector, and split light reflected by the light reflector into K reflected light beams to feed the K reflected light beams into the K waveguide cores, respectively.

12. The laser device according to claim 11, wherein the back-end branch waveguide includes a multimode interference-based branch waveguide.

13. The laser device according to claim 10, further comprising:
a third intermediate branch waveguide interposed between the first bus waveguide and the second ring resonator and optically coupled to a light input/output end of the first bus waveguide;
a third connecting waveguide optically coupled to the first end of the second ring resonator;
a fourth connecting waveguide interposed between the second ring resonator and the second bus waveguide and optically coupled to the second end of the second ring resonator; and
a fourth intermediate branch waveguide configured to split, into K light beams, light input from the second ring resonator through the fourth connecting waveguide and feed the K light beams into the K waveguide cores, wherein:
the first bus waveguide includes M waveguide cores where M is an integer equal to or larger than two, each waveguide core being optically coupled to the second end of the first ring resonator and configured to carry light input from the second end of the first ring resonator;
the M waveguide cores are placed in proximity to one another to enable optical coupling between adjacent waveguide cores of the M waveguide cores;
the third intermediate branch waveguide is configured to combine M light beams input from the M waveguide cores to generate composite light; and
the third connecting waveguide is configured to feed the composite light input from the third intermediate branch waveguide into the second ring resonator.

14. The laser device according to claim 6, wherein:
the first ring resonator includes L ring-shaped waveguide cores that are concentrically disposed where L is an integer equal to or larger than two; and
the L ring-shaped waveguide cores are placed in proximity to one another to enable optical coupling between adjacent waveguide cores of the L ring-shaped waveguide cores.

15. The laser device according to claim 6, wherein:
the second ring resonator includes P ring-shaped waveguide cores that are concentrically disposed where P is an integer equal to or larger than two; and
the P ring-shaped waveguide cores are placed in proximity to one another to enable optical coupling between adjacent waveguide cores of the P ring-shaped waveguide cores.

16. The laser device according to claim 6, further comprising temperature adjusting elements connected to the first ring resonator and the second ring resonator, respectively.

17. A laser device comprising:
an optical amplifier;
an input/output waveguide having a light input/output end that is optically coupled to the optical amplifier, and including a single waveguide core;
a first ring resonator having a first end that is optically coupled to a portion of the input/output waveguide;
a first bus waveguide optically coupled to a second end of the first ring resonator, and configured to carry light input from the second end of the first ring resonator;
a second ring resonator having a first end that is optically coupled to a portion of the first bus waveguide;
a second bus waveguide optically coupled to a second end of the second ring resonator, and configured to carry light input from the second end of the second ring resonator; and
a light reflector optically coupled to a light input/output end of the second bus waveguide, wherein:
the first ring resonator includes L ring-shaped waveguide cores that are concentrically disposed where L is an integer equal to or larger than two; and the L ring-shaped waveguide cores are placed in proximity to one another to enable optical coupling between adjacent waveguide cores of the L ring-shaped waveguide cores.

18. The laser device according to claim 17, wherein:

the second ring resonator includes P ring-shaped waveguide cores that are concentrically disposed where P is an integer equal to or larger than two; and the P ring-shaped waveguide cores are placed in proximity to one another to enable optical coupling between adjacent waveguide cores of the P ring-shaped waveguide cores.

19. A laser device comprising:

an optical amplifier;

an input/output waveguide having a light input/output end that is optically coupled to the optical amplifier, and including a single waveguide core;

a first ring resonator having a first end that is optically coupled to a portion of the input/output waveguide;

a first bus waveguide optically coupled to a second end of the first ring resonator, and configured to carry light input from the other end of the first ring resonator;

a second ring resonator having a first end that is optically coupled to a portion of the first bus waveguide;

a second bus waveguide optically coupled to a second end of the second ring resonator, and configured to carry light input from the second end of the second ring resonator; and a light reflector optically coupled to a light input/output end of the second bus waveguide, wherein:

the second ring resonator includes P ring-shaped waveguide cores that are concentrically disposed where P is an integer equal to or larger than two; and the P ring-shaped waveguide cores are placed in proximity to one another to enable optical coupling between adjacent waveguide cores of the P ring-shaped waveguide cores.

* * * * *